US009620987B2

(12) United States Patent
Alexander et al.

(10) Patent No.: US 9,620,987 B2
(45) Date of Patent: *Apr. 11, 2017

(54) SYSTEM AND METHOD FOR A DYNAMICALLY CONFIGURABLE POWER DISTRIBUTION CONTROL AND MANAGEMENT SYSTEM

(71) Applicant: Eagle Harbor Holdings, LLC, Bainbridge Island, WA (US)

(72) Inventors: Kevin Alexander, Allyn, WA (US); Michael Bannerman, Ferndale, WA (US); Isaac Burbank, Oakland, CA (US); Braden Copple, Sultan, WA (US); Kyle Pease, Missoula, MT (US)

(73) Assignee: EAGLE HARBOR HOLDINGS, LLC, Bainbridge Island, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/994,326

(22) Filed: Jan. 13, 2016

(65) Prior Publication Data

US 2016/0126781 A1    May 5, 2016

Related U.S. Application Data

(63) Continuation of application No. 13/868,843, filed on Apr. 23, 2013, now Pat. No. 9,293,928.
(Continued)

(51) Int. Cl.
*H02J 7/00*    (2006.01)
*H02J 7/02*    (2016.01)
(Continued)

(52) U.S. Cl.
CPC .............. *H02J 7/025* (2013.01); *H02J 3/14* (2013.01); *H02J 7/0013* (2013.01);
(Continued)

(58) Field of Classification Search
USPC ........................................................ 320/134
See application file for complete search history.

(56) References Cited

U.S. PATENT DOCUMENTS 3,844,841 A    10/1974  Baker
5,002,500 A    3/1991   Zuccaro et al.
(Continued)

OTHER PUBLICATIONS

Specification of the Bluetooth System Version 4.0, dated Jun. 30, 2010; 2302 pages.
(Continued)

*Primary Examiner* — Yalkew Fantu
(74) *Attorney, Agent, or Firm* — Schwabe Williamson & Wyatt

(57) ABSTRACT

A dynamically configurable battery management system includes a controller system with a first processor connected to a first memory and a first wireless transceiver connected to a wireless packet network. A battery system with a second processor is connected to a second memory and a second wireless transceiver connected to the wireless packet network. One or more batteries are connected to the battery system, and the connected batteries include a battery pack. A sensor that is connected to the battery system generates a data stream that is stored in the second memory. The data stream allows for establishing a battery capability and status unique to each battery in the battery pack. The stored data stream is stored as a battery record with a universal unique identifier.

30 Claims, 32 Drawing Sheets

Related U.S. Application Data

(60) Provisional application No. 61/638,874, filed on Apr. 26, 2012.

(51) Int. Cl.
*H02J 3/14* (2006.01)
*H02J 7/04* (2006.01)
*H02J 13/00* (2006.01)

(52) U.S. Cl.
CPC ............ *H02J 7/0021* (2013.01); *H02J 7/045* (2013.01); *H02J 7/047* (2013.01); *H02J 13/0075* (2013.01); *H02J 13/001* (2013.01); *Y02B 70/3225* (2013.01); *Y02B 90/2653* (2013.01); *Y02P 80/14* (2015.11); *Y04S 20/222* (2013.01); *Y04S 40/126* (2013.01)

(56) References Cited

U.S. PATENT DOCUMENTS

| | | | |
|---|---|---|---|
| 5,174,777 A | 12/1992 | Carter | |
| 5,596,567 A | 1/1997 | DeMuro et al. | |
| 6,078,165 A | 6/2000 | Ashtiani et al. | |
| 6,089,929 A | 7/2000 | Sloey | |
| 6,309,231 B1 | 10/2001 | Gordon et al. | |
| 6,340,538 B1 | 1/2002 | King | |
| 6,526,293 B1 | 2/2003 | Matsuo | |
| 7,002,265 B2 * | 2/2006 | Potega .................. | B60L 11/185 307/149 |
| 7,394,394 B2 | 7/2008 | Lockhart et al. | |
| 7,457,693 B2 * | 11/2008 | Olsen .................. | B60R 25/1004 180/287 |
| 7,528,572 B2 | 5/2009 | Masias et al. | |
| 7,554,294 B2 | 6/2009 | Srinivasan et al. | |
| 7,598,880 B2 | 10/2009 | Powell et al. | |
| 7,667,432 B2 | 2/2010 | West et al. | |
| 7,734,317 B2 * | 6/2010 | Patel ..................... | H02J 7/0013 320/129 |
| 7,774,151 B2 | 8/2010 | Bertness | |
| 7,960,047 B2 | 6/2011 | Berg | |
| 8,045,922 B2 | 10/2011 | Sherman et al. | |
| 8,147,426 B2 | 4/2012 | Neel et al. | |
| 2001/0000423 A1 * | 4/2001 | Fischer ................. | H02J 7/0031 320/114 |
| 2002/0022159 A1 | 2/2002 | Pierson et al. | |
| 2002/0037756 A1 | 3/2002 | Jacobs et al. | |
| 2005/0035741 A1 * | 2/2005 | Elder .................... | B60L 3/0046 320/116 |
| 2005/0038614 A1 | 2/2005 | Botts et al. | |
| 2009/0066291 A1 | 3/2009 | Tien et al. | |
| 2009/0115252 A1 * | 5/2009 | Caraghiorghiopol ..... | H02J 1/10 307/48 |
| 2009/0270689 A1 | 10/2009 | Galland | |
| 2010/0097033 A1 * | 4/2010 | Tange ................... | H02J 7/0026 320/116 |
| 2010/0173188 A1 | 7/2010 | Dhawan et al. | |
| 2010/0178547 A1 | 7/2010 | Li | |
| 2010/0210318 A1 | 8/2010 | Zhu et al. | |
| 2011/0248678 A1 | 10/2011 | Wade et al. | |

OTHER PUBLICATIONS

IEEE 802.11n Specification for Wireless Local Area Networks, 2009; 536 pages.
IEEE 802.2 Standard for Information Technology, 1998; 253 pages.
Drew Gislason, "Zigbee Wireless Networking", 2008; 427 pages.

* cited by examiner

SYSTEM AND METHOD FOR A DYNAMICALLY CONFIGURABLE POWER DISTRIBUTION CONTROL AND MANAGEMENT SYSTEM

DOMESTIC BENEFIT/NATIONAL STAGE INFORMATION

The present application claims priority to Provisional Patent Application Ser. No. 61/638,874 filed Apr. 26, 2012 which is hereby incorporated in its entirety.

REFERENCES CITED

Other Publications

"How 802.11 Works", August 2010; "Zigbee Wireless Networking", 2008; "IEEE Standard for Information Technology", 1998.

U.S. Patent Documents

| | | |
|---|---|---|
| U.S. Pat. No. 8,045,922 B2 | October 2011 | Itay, Sherman, et al |
| U.S. Pat. No. 8,147,426 | Apr. 3, 2012 | Neel, et al |
| U.S. Pat. No. 7,528,572 | May 5, 2009 | Masias, et al |
| US 2010/0210318 | August 2010 | Zhu, et al |
| US 2009/0270689 A1 | October 2009 | Beaufort Galland |
| U.S. Pat. No. 6,526,293 B1 | February 2003 | Ryuji Matsuo |
| US 2002/0037756 A1 | March 2002 | Jacobs, et al |
| U.S. Pat. No. 5,596,567 | January 1997 | deMuro, et al |
| US 2002/0022159 A1 | February 2002 | Pierson, et al |
| U.S. Pat. No. 7,667,432 B2 | February 2010 | West, et al |
| US 2010/0178547 A1 | July 2010 | Kevin Li |
| US 2010/0173188 A1 | July 2010 | Dhawan, et al |
| U.S. Pat. No. 6,340,538 B1 | January 2002 | Gary Jack King |
| U.S. Pat. No. 3,844,841 | October 1974 | Bernard Baker |
| U.S. Pat. No. 5,002,500 | March 1991 | Zuccaro, et al |
| U.S. Pat. No. 6,089,929 | July 2000 | Jason S. Sloey |
| U.S. Pat. No. 6,309,231 B1 | October 2001 | Gordon, et al |
| U.S. Pat. No. 5,174,777 | December 1992 | D. Paul Carter |
| U.S. Pat. No. 7,774,151 B2 | August 2010 | Kevin L. Bertness |

BACKGROUND OF THE INVENTION

Field of the Invention

The present invention generally relates to an energy management system for energy storage devices. More particularly, the present invention relates to a complex modular battery management and communication system for multi-cell battery packs which are suitable for any type of equipment that uses a portable energy supply including electric or hybrid vehicles, handheld portable tools, electric power supplies, etc.

Description of Related Art

In a discussion of prior art, U.S. Pat. No. 7,734,317 generally describes systems and techniques that rotate to wireless communications. The systems and techniques described involve the use of an efficient power source for prolonged battery life. The power source includes more than one battery, and a power management module. The management module is configured to operate each battery in a pulse current discharge mode while supplying continuous current load. What the inventor failed to disclose were systems and methods for dynamic battery configuration, wireless communication between battery packs and controllers, and automatic battery ID assignment.

In a discussion of prior art, U.S. Pat. No. 6,078,165 generally describes systems and techniques that relate to an energy management system for monitoring an energy storage device. The energy management system includes more than one battery forming the energy storage device. Each of the batteries includes a physical connection for communication. A local module is connected to the batteries which make up the energy storage device. The local module has multiple inputs for receiving the voltage signals generated by the batteries. The local module provides a combined output signal. A processor is provided for receiving the output signal from the local module and monitoring the voltage signals produced by the energy storage device. What the inventor failed to disclose were systems and methods for dynamic battery configuration, wireless communication between battery packs and controllers, and automatic battery ID assignment.

In a discussion of prior art, U.S. Pat. No. 7,960,047 generally describes the measurement of physical properties and individual charge control of the cells of a battery which may lead to a longer battery life and to a more reliable operation. The present invention discloses a system, a cell unit, a control unit and a method for the automated management of batteries via a wireless communication link. According to the invention, the life cycle of individual cells of a battery may be tracked and recorded by an external control unit. Advantageously, active control of the battery cells is provided, including the ability to provide a short circuit between respective poles of battery cells. What the inventor failed to disclose were systems and methods for dynamic battery configuration non-contact methods of measuring cell properties, onboard memory on the power system controllers, and automatic battery ID assignment.

In a discussion of prior art, Pub #US 2011/0248678 A1 generally describes a battery charging system and method. This system includes a high voltage charger for charging a string of battery cells. There is also a supplemental charger across each battery cell in a string. The method for charging this string is to use the high voltage charger until at least one cell being charged gets to a predetermined voltage. The high voltage charger is then disabled. The supplemental charger then continues to charge individual cells until they all reach a predetermined voltage. What the inventor failed to disclose were systems and methods for different modes of charging methods for charging cells other than lithium ion, and keeping tracking of cell history via automatic battery ID assignment.

In a discussion of prior art, U.S. Pat. No. 7,394,394 generally describes an apparatus and method for monitoring at least one battery condition. An AC test current is applied to a battery and a difference between the signal output from the battery and a preset value determines a battery condition. The determined battery condition is transmitted remotely from the battery location through a controller to a network server and is visibly displayed at the battery location. What the inventor failed to disclose were systems and methods for wirelessly communicating with a charging device capable of multiple charging methods, methods of being dynamically capable of adding of withdrawing new batteries to the system and methods for actively controlling battery temperature rather than just monitoring and reporting.

In a discussion of prior art, U.S. Pat. No. 7,598,880 generally describes an apparatus and method for a wireless battery monitoring system and method including a receiver and a set of wireless transmitters. The transmitters are connected to a corresponding battery and are able to identify the corresponding battery. The transmitters are programmed to transmit data regarding the corresponding battery, such as voltage, temperature, balancer activity, etc, to the receiver. What the inventor failed to disclose were systems and methods for communicating with a charging device capable of multiple charging methods, methods of being dynamically capable of adding or withdrawing new batteries to the system and methods for actively controlling battery temperature rather than just monitoring and reporting.

In a discussion of prior art, Pub #2005/0038614 A1 generally describes an apparatus and method for a remote battery monitoring system. Sensors are disclosed in which one or more sensors are connected to batteries in a battery string. The sensors measure battery data such as voltage, current, and temperature and wirelessly transmit the battery data to a control and collection unit. The control and collection unit receives, processes, analyzes, and stores the battery data. Remote monitoring software running on the control and collection unit can be configured to provide warning alarms when the battery data is outside present limits. What the inventor failed to disclose were systems and methods for of being dynamically capable of adding or withdrawing new batteries to the system, systems and methods for wirelessly communicating necessary charging methods with a charging device and methods for actively controlling battery temperature rather than just monitoring and reporting.

In a discussion of prior art, Pub #2009/0066291 A1 generally describes an apparatus and method for a Distributed Energy Storage Control System (DESCS) comprising one or more identical Battery Management System units, series-parallel system controller and DESCS main controller. This DESCS system promotes the energy efficiency of batteries, provides on-line repair or replacement of batteries and can charge/discharge during maintenance. What the inventor failed to disclose were systems and methods for automatic battery ID assignment, systems and methods for communicating with a charging device capable of multiple charging methods and systems and methods for actively controlling battery temperature by means other than bypassing.

So as to reduce the complexity and length of the Detailed Specification, and to fully establish the state of the art in certain areas of technology, Applicant(s) herein expressly incorporate(s) by reference all of the following materials identified in each numbered paragraph below.

Specification of the Bluetooth System Version 4.0, dated 17 Dec. 2009 is incorporated by reference and is therefore not described in further detail.

IEEE 802.11n specification for Wireless Local Area Networks dated 29 Sep. 2009 is incorporated by reference and is therefore not described in further detail.

IEEE 802.2 Standard for Information Technology dated 1998 is incorporated by reference and is therefore not described in further detail.

U.S. Pat. No. 7,554,294 B2 "Battery Health Monitor" dated 30 Jun. 2009 is incorporated by reference and is therefore not described in further detail.

Applicant(s) believe(s) that the material incorporated above is "non-essential" in accordance with 37 CFR 1.57, because it is referred to for purposes of indicating the background of the invention or illustrating the state of the art. However, if the Examiner believes that any of the above incorporated material constitutes "essential material" within the meaning of 37 CFR 1.57(c)(1)-(3), applicant(s) will amend the specification to expressly recite the essential material that is incorporated by reference as allowed by the applicable rules.

BRIEF SUMMARY OF THE INVENTION

The above and other objects of the invention are achieved in a preferred embodiment of the invention by a system and methods disclosed herein for providing a wireless dynamically configured power distribution and control system. The system includes a central unit, connected to a wireless transceiver and a processor with memory; a remote unit with a second transceiver connected to a second processor including memory; batteries connected to the remote unit; a wireless network for communicating between the controller and the remote unit; and one or more sensors connected to the second processor for monitoring predetermined values.

Wherein the processors are configured to detect connections to one or more batteries; store data into memory; detect a connection to a battery cell controller; transmit data to the controller; allow charge or discharge at predetermined rates; and use the packet network to transmit the data based on predetermined conditions.

Aspects and applications of the invention presented here are described below in the drawings and detailed description of the invention. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect as their own lexicographers, to use only the plain and ordinary meaning of terms in the specification and claims unless they clearly state otherwise and then further, expressly set forth the "special" definition of dial term and explain how it differs from the plain and ordinary meaning. Absent such clear statements of intent to apply a "special" definition. It is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to these skilled in the applicable arts as set forth above.

Further, the inventors are fully informed of the standards and application of the special provisions of 35 U.S.C. §112, ¶6. Thus, the use of the words "function," "means" or "step" in the Detailed Description or Description of the Drawings or claims is not intended to somehow indicate a desire to invoke the special provisions of 35 U.S.C. §112, ¶6, to define the invention. To the contrary, if the provisions of 35 U.S.C. §112, ¶6 are sought to be invoked to define the inventions, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then if is the clear intention of the inventors not to invoke the provisions of 35 U.S.C. §112, ¶6. Moreover, even if the provisions of 35 U.S.C. §112, ¶6 are invoked to define the claimed inventions, it is intended that the inventions not be limited only to the specific structure, material or acts that are described in the preferred embodiments, but in addition, include any and all structures, materials or acts that perform the claimed function as described in alternative embodiments or forms of the invention, or that are well known present or later developed, equivalent structures, material or acts for performing the claimed function.

The foregoing and other objects, features and advantages of the invention will become more readily apparent from the following detailed description of a preferred embodiment of the invention which proceeds with reference to the accompanying drawings. Other aspects of the invention will be appreciated by those skilled in the art after reviewing the following detailed description of the invention.

BRIEF DESCRIPTION OF THE SEVERAL VIEWS OF THE DRAWINGS

A more complete understanding of the present invention may be derived by referring to the detailed description when considered in connection with the following illustrative figures. In the figures, like reference numbers refer to like elements or acts throughout the figures.

FIG. 3 (System Startup Sequence) is a diagram that depicts a set of operations necessary for the system to attain a fully operational state upon being power on.

Elements and acts in the figures are illustrated for simplicity and have not necessarily been rendered according to any particular sequence or embodiment.

DETAILED DESCRIPTION OF THE INVENTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

In this embodiment one or more batteries are used as the energy storage and conversion devices which are storing energy and providing energy to a load. The term cell in this embodiment is referring to a rechargeable battery which is a group of one or more rechargeable electrochemical cell, but this system and method is capable of controlling and managing a broad range of energy storage and conversion devices such as, electrochemical cells, electrolytic cells, Galvanic cells, capacitors, and fuel cells; and this system and method can manage energy stored in a broad range of energy forms such as chemical, electrical, thermal, and potential energy. Examples of batteries which can be used in this system include but are not limited to lead acid, lithium air, lithium-ion, lithium-polymer, nickel-iron, nickel-zinc, nickel-metal hydride, iron-air, zinc-air, zinc-bromine, vanadium redox, sodium-sulfur, sodium-nickel chloride, lithium-iron sulfides, nickel-cadmium and flow batteries. Examples of fuel cells which can be used in this system include but are not limited to hydrogen and hydrocarbon fuel cells. Examples of capacitors which can be used in this system include but are not limited to variable capacitors and super capacitors. Those skilled in the relevant arts could apply this system to other forms of energy storage or a combination of cell types or forms of energy storage devices.

Figure 1:
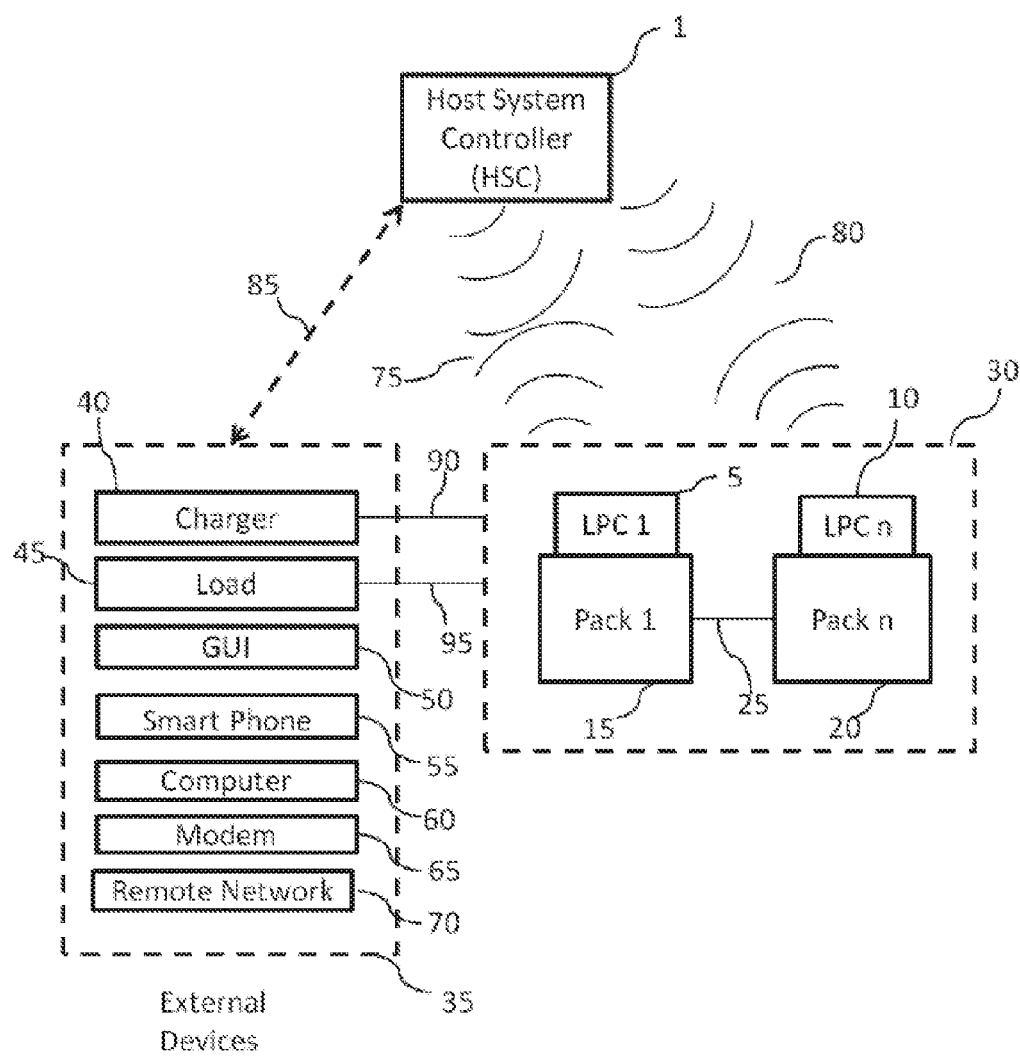
FIG. 1 (System Communication Overview) is a diagram that depicts communication between the Host System Controller (HSC), Local Pack Controller (LPC), and external devices.

In one application of the invention FIG. 1 shows an overview of components that can communicate within the dynamically configurable power distribution control and management system as well as how the controllers can communicate with devices and networks outside of the system. In the application of the invention given in this disclosure, this system will be explained in the context of being used to control and manage the power system within a vehicle. Vehicles are only one possible application for this power distribution control and management system, but will be used in order to more clearly disclose the invention. All networking and communications protocols mentioned are chosen to give examples of novel applications of this invention, but those skilled in the relevant arts can configure this system to communicate through many types of networks such as TCP/IP and LIN, CAN, J-1850, MI, DI, BST, MML, byteflight, flexray, IDB, 1394 and J-1708 CAN bus networks. The local controllers (5, 10), which control each of the one or more packs (15, 20) of batteries, can communicate with a host controller 1 through a wireless network (75, 80) such as Bluetooth, ZigBee, or 802.11. The host controller 1 communicates with all local controllers 30 in the system as well as all external devices 35 such as a GUI 50, smart phone 55, computer 60, modem 65, remote network 70, charger 40, and the one or more load devices 45. The host controller 1 can communicate with the external devices 35 through a wireless connection such as those mentioned above as well as through a serial or parallel wired connection 85. The host controller 1 may also be integrated into another device such as an electronic control unit, a local controller 5 or into software in another device such as a computer 60 or smart phone 55. The host controller 1 may communicate with the charger 40 through a wireless network 85 such as those mentioned above or through a serial or parallel wired connection in the charger port 90. The load will be directly connected 95 to the packs 30, but the host controller 1 may also communicate with the load device 45 to retrieve information such as the device's type and load specifications. The host controller 1 may also analyze the firmware version and code installed on all local controllers (5, 10) within the system, and can make automatic firmware upgrades as well as ad any code necessary to the local controllers (5, 10) for optimal system performance. Packs 15, 20 may be connected to each other 25 in series or parallel, or may be individually connected to one or more devices which require power.

Figure 2:
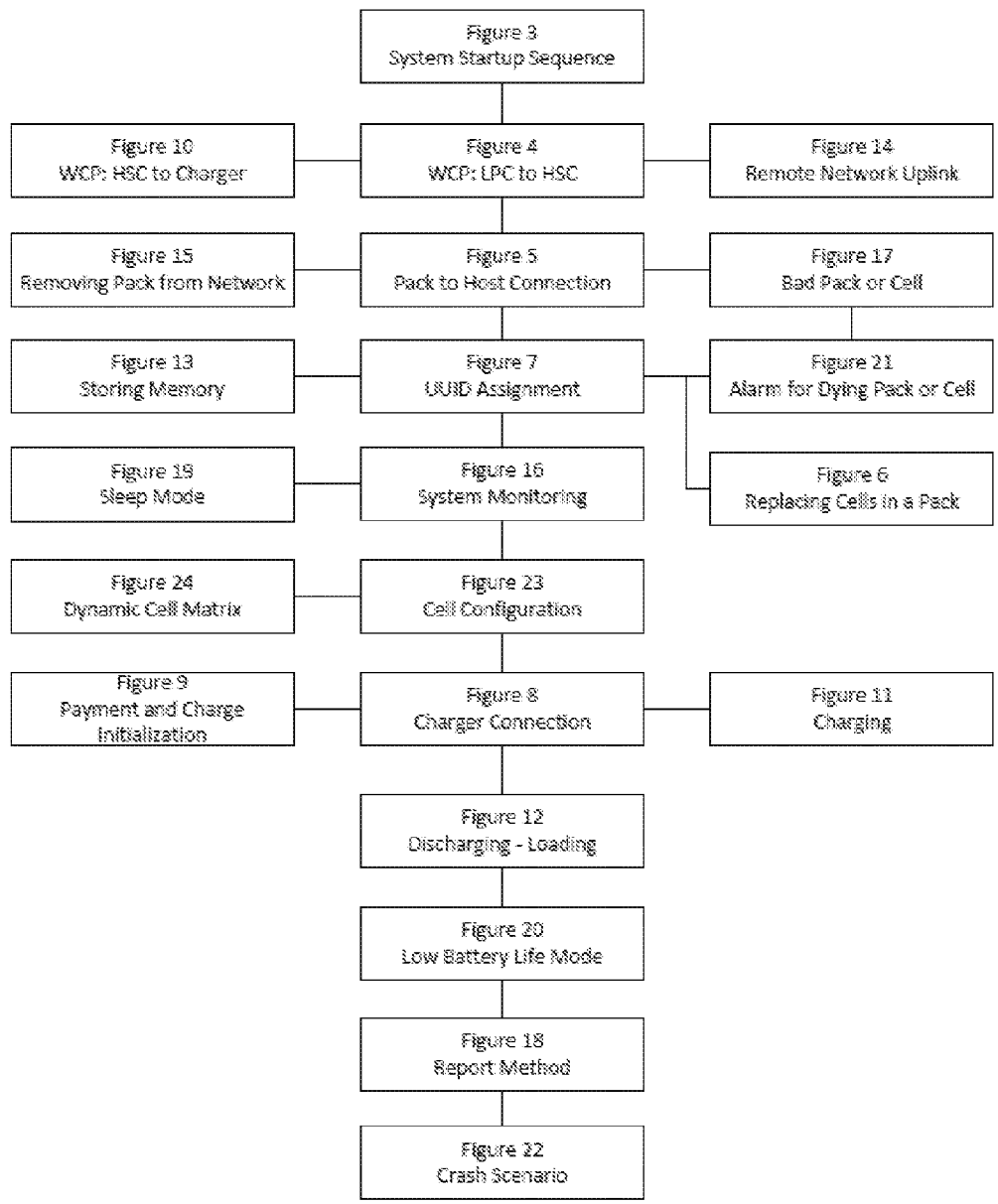
FIG. 2 (System Process Map) is a diagram that depicts the general associations between processes.

FIG. 2 is a System Process Map which is made to give the reader an overview of the processes described in this embodiment. The processes are arranged in this figure to give the reader a basic understanding of the relationships between some of the processes as well as to provide a single figure which includes all described processes to aid in understanding the system structure. It also serves to provide a reference to what process figures will be described in this disclosure.

Figure 3:
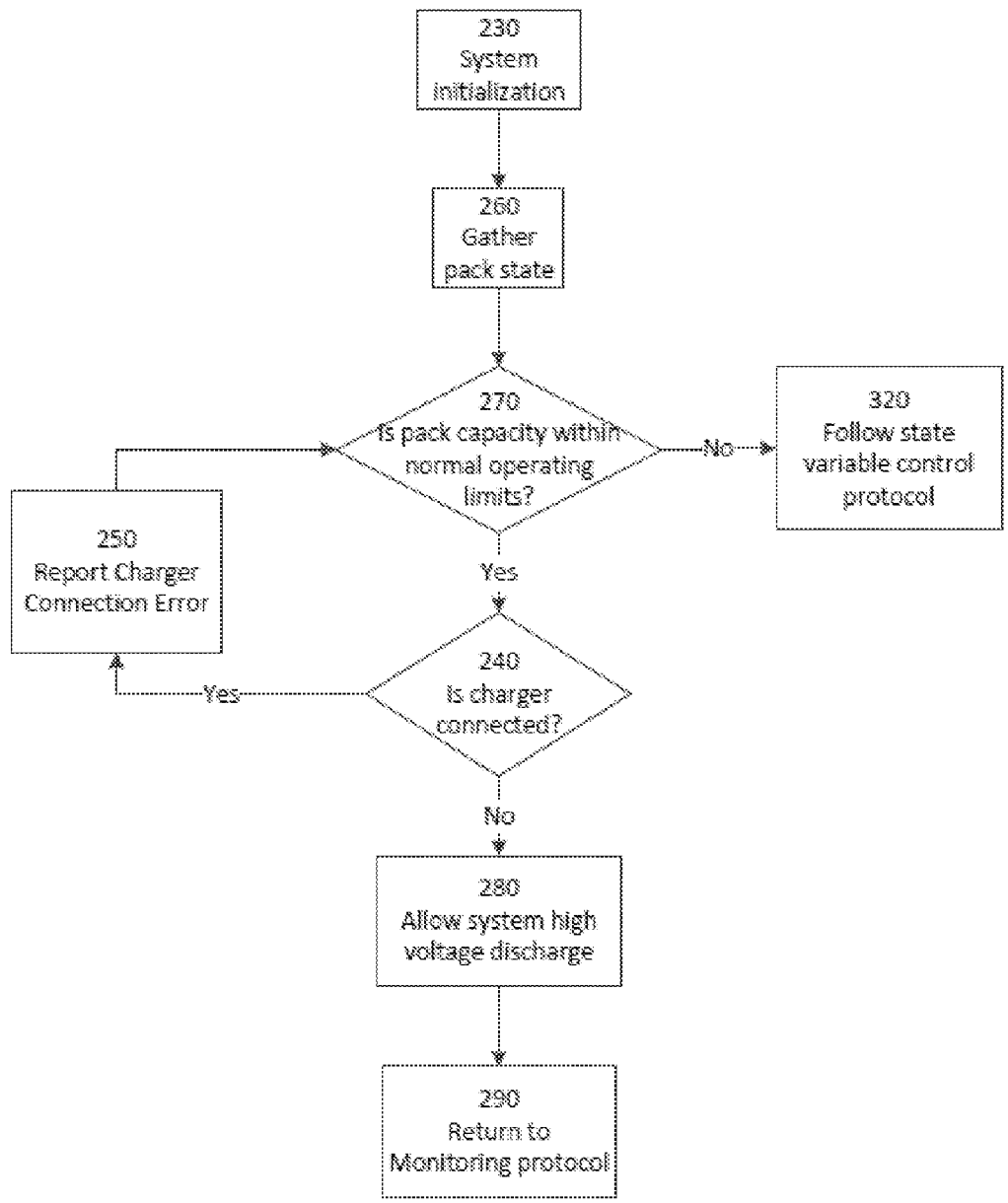

FIG. 3 describes a System Startup Sequence for the power distribution and control system where 230 describes the system being turned on by a method such as turning the ignition on a vehicle, plugging a charger into the system, bringing a wireless access key such as a wireless transceiver in a device or a smart phone with appropriate software and access clearance within a predefined range of the system, or pressing a button on a remote device. When the system is turned on it will gather predetermined information 260 about the power system such as whether the host controller can communicate with local controllers and whether anything has been removed or changed in the system. Block 270 is a decision block determining whether predetermined system state variables such as voltage, temperature, and available current are within predetermined operating limits. If a system variable is outside of predetermined limits the system activates the appropriate state variable control method such as heating or cooling batteries to keep them in a predetermined temperature range; however if the predetermined variables are within the predetermined limits, the system moves to another decision block 240 which determined if a charger is connected to the system. If a charger is connected to the system, the charger connection is reported 250 and the system begins the charging protocol (see fig FD20); however if the charger is not connected, the system enables high voltage discharge 280 and completes the system startup sequence 290.

Figure 4:
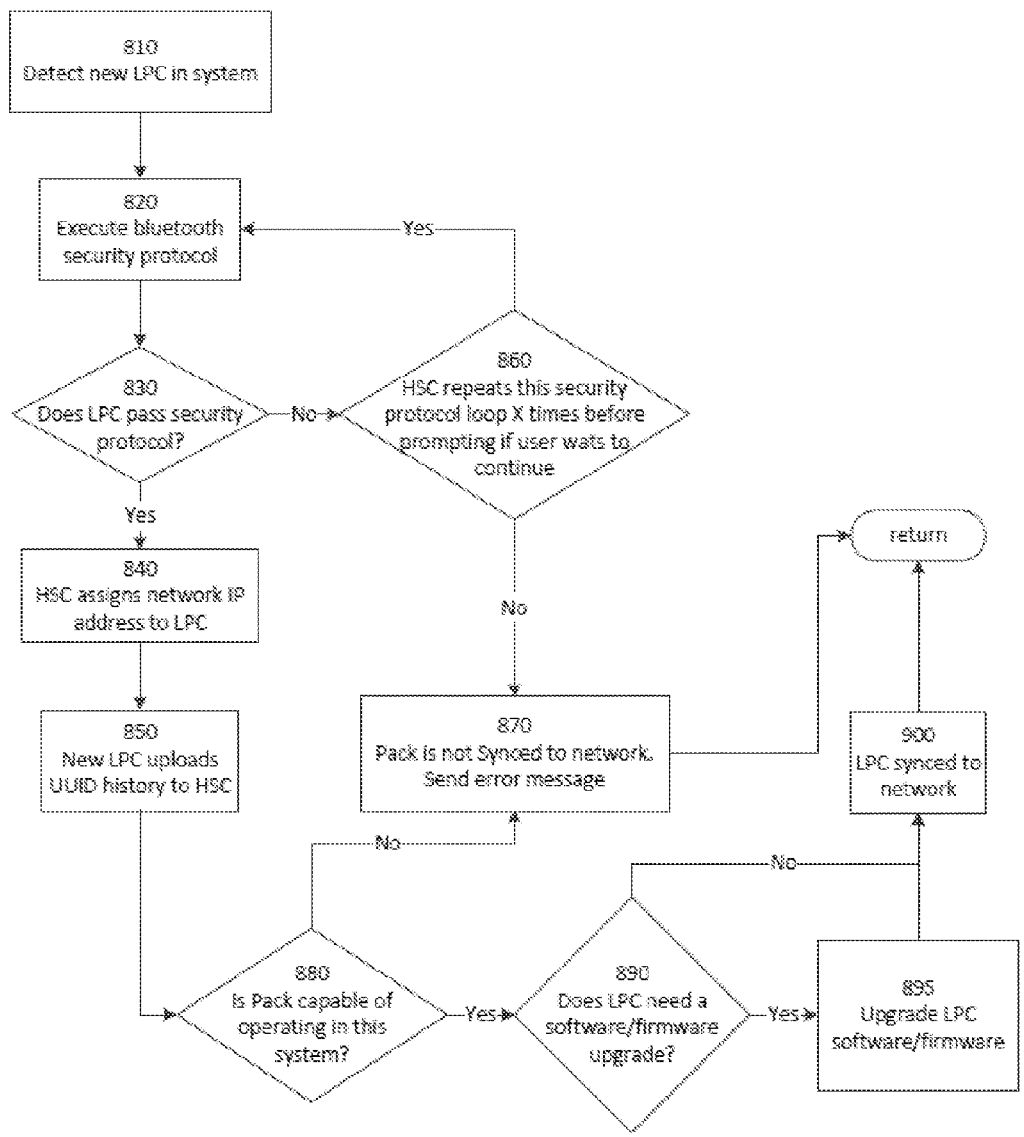
FIG. 4 (Wireless Connection Protocol) is a diagram that depicts a procedure for connecting HSC and LPC wireless transceivers.

FIG. 4 describes creating a wireless connection between the host and local controllers. When the host controller detects a local controller within connection range 810 it executes a secure connection protocol 820 such as Bluetooth. The secure connection protocol 820 can include a step where the local controller is given a network password to send to the host controller, or s secure connection may be initiated by using a device such as a wireless transponder to place near one of the controllers to retrieve secure connection data and then place near the other controller to transmit that secure connection data. 830 is a decision block which determines whether the local controller successfully completed the secure connection to the network. If the connection is successful the host controller retrieves the local controller ID and assigns the local controller a network address 840; however if the connection is not successful the decision block 860 determines if the controllers should attempt to connect again. If the system determines that the controller should attempt another connection, the secure connection protocol is initialed again 820; however if the system determines that he controllers should not attempt another connection, an error message is reported 870. If the system completes the retrieval of the battery ID and assigning a network address for the local controller 840, the local controller will upload predetermined information such as controller model, current software version, pack performance history, and current pack state 850. The host controller will determine if the pack of the new local controller is capable of operating within the system in decision block 880. If the pack is not capable of operating in the system, the host controller will generate an error message 870; however if the pack is capable of operating in the system, the host controller will determine if the local controller software needs to be reconfigured for optimized system performance in decision block 890. If the local controller needs to be configured, the host controller configuration manager <no figure> will configure the local controller to operate optimally within the system 895; then, complete the wireless connection protocol 900; however if the local controller does not need to be configured, the system will complete the connection protocol 900.

Figure 5:
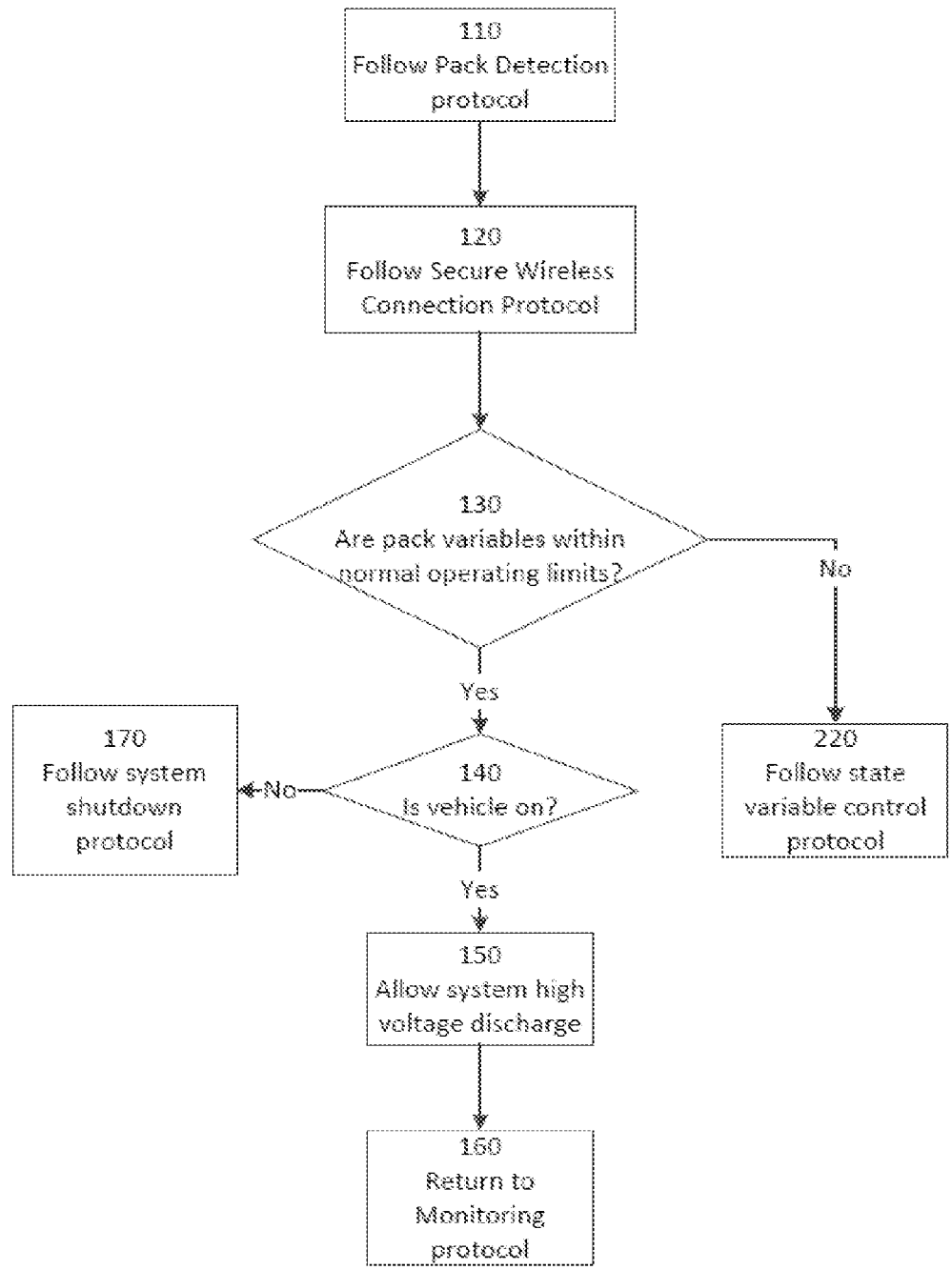
FIG. 5 (Connecting a Pack to a Host System) is a diagram that depicts a set of operations for connecting the pack to the host system. The pack contains an LPC dial is to wirelessly connect to the HSC after the pack has been physically inserted into the system.

FIG. 5 describes Connecting a Pack to the System where 110 describes using a detection protocol such as Bluetooth 802.11, or Near Field Communication (NFC) to detect that a pack has been added to a system, and then initiate a wireless connection. Block 120 calls the secure wireless connection method (see FIG. 4). Block 130 is a decision block determining whether or not the system is ready to be used. If the system is ready to be used, 140 determines if the vehicle is on. If the vehicle is not on, follow system shutdown protocol where the system shutdown protocol includes saving all predetermined data to memory and transferring the system into its lowest power state; however if the system is on 150, high voltage discharge is enabled; 160 describes pack monitoring protocol (see FIG. 16). If 130 is not within normal operating limits, determine what is wrong and follow state variable control protocol 220 where the state variable control protocol includes actions to keep the system within a predetermined healthy range, such as changing the load distribution across batteries and packs to keep they system balanced, and heating or cooling batteries to keep them near their optimum operation temperature.

Figure 6:
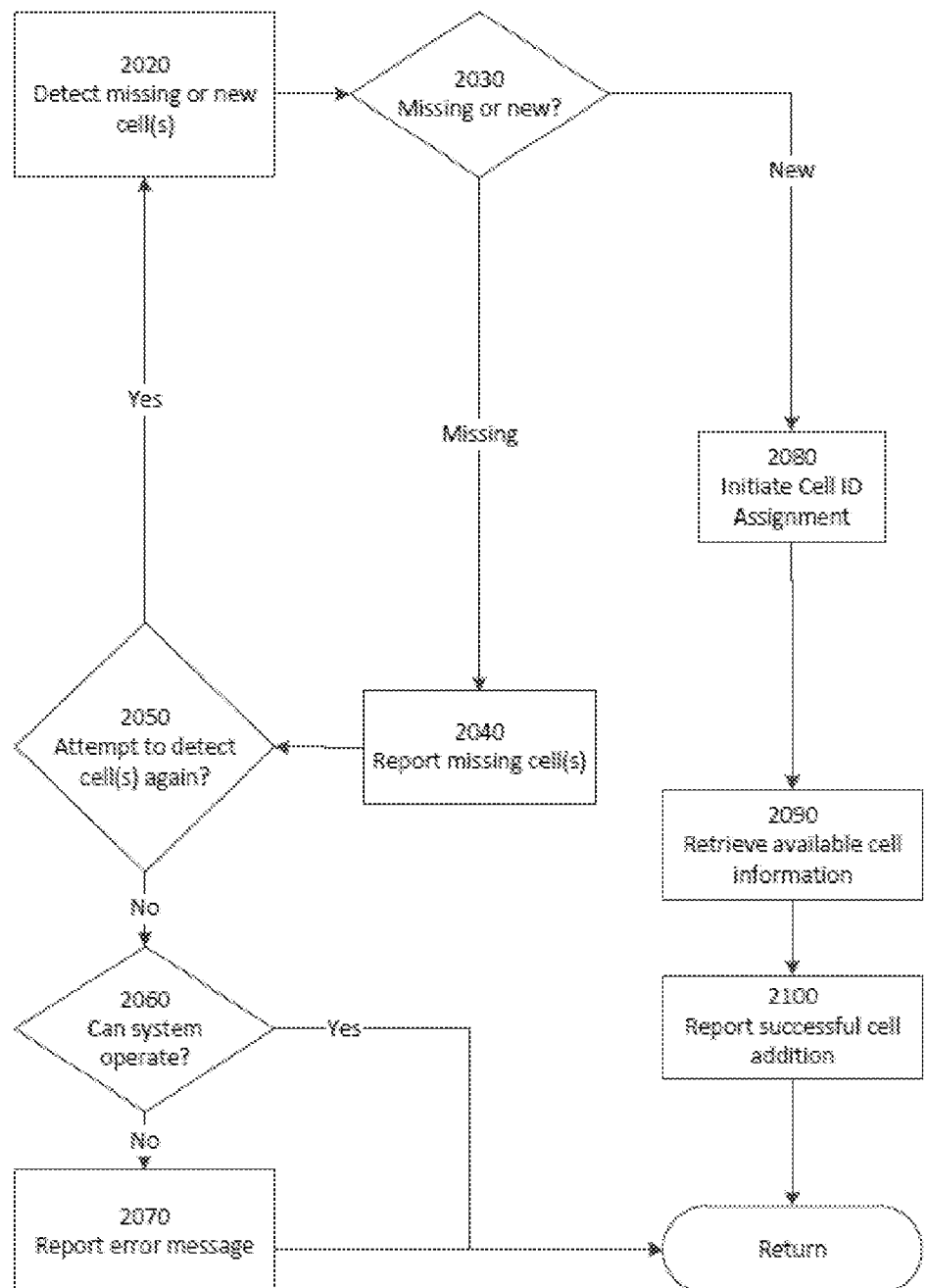
FIG. 6 (Replacing Cells in a Pack) is a diagram that depicts a sequence of removing cells, defecting new cells, and connecting the cells to the system.

FIG. 6 describes Replacing Batteries in a Pack where 2020 describes a local or host controller detecting one or more new or missing batteries. 2030 is a decision block determining whether a battery in a battery location in missing or new. If the battery is missing 2040 a controller will report the missing battery; however if the location has a new battery 2000, a controller will initiate Battery ID Assignment (see FIG. 7). 2050 is a decision block determining whether a controller should attempt to detect a new battery again at location where a battery was reported missing. If it is determined that another battery detection attempt should be made, the process of detecting missing or new batteries is reinitiated 2020; however if it is determined that another detection attempt will not be made, a controller will determine whether the system can still operate (decision block 2060). If the system can still operate, a controller will complete the Replacing Batteries in a Pack process, however if the system cannot operate, an error message is reported 2070 before a controller completes the Replacing a Battery in a Pack process. After the battery ID assignment 2080, the controller attempts to retrieve predetermined information 2090 from the new battery such as battery performance history, battery model, battery voltage, and available current. Then a report is generated that the battery was successfully added to the system 2100.

Figure 7:
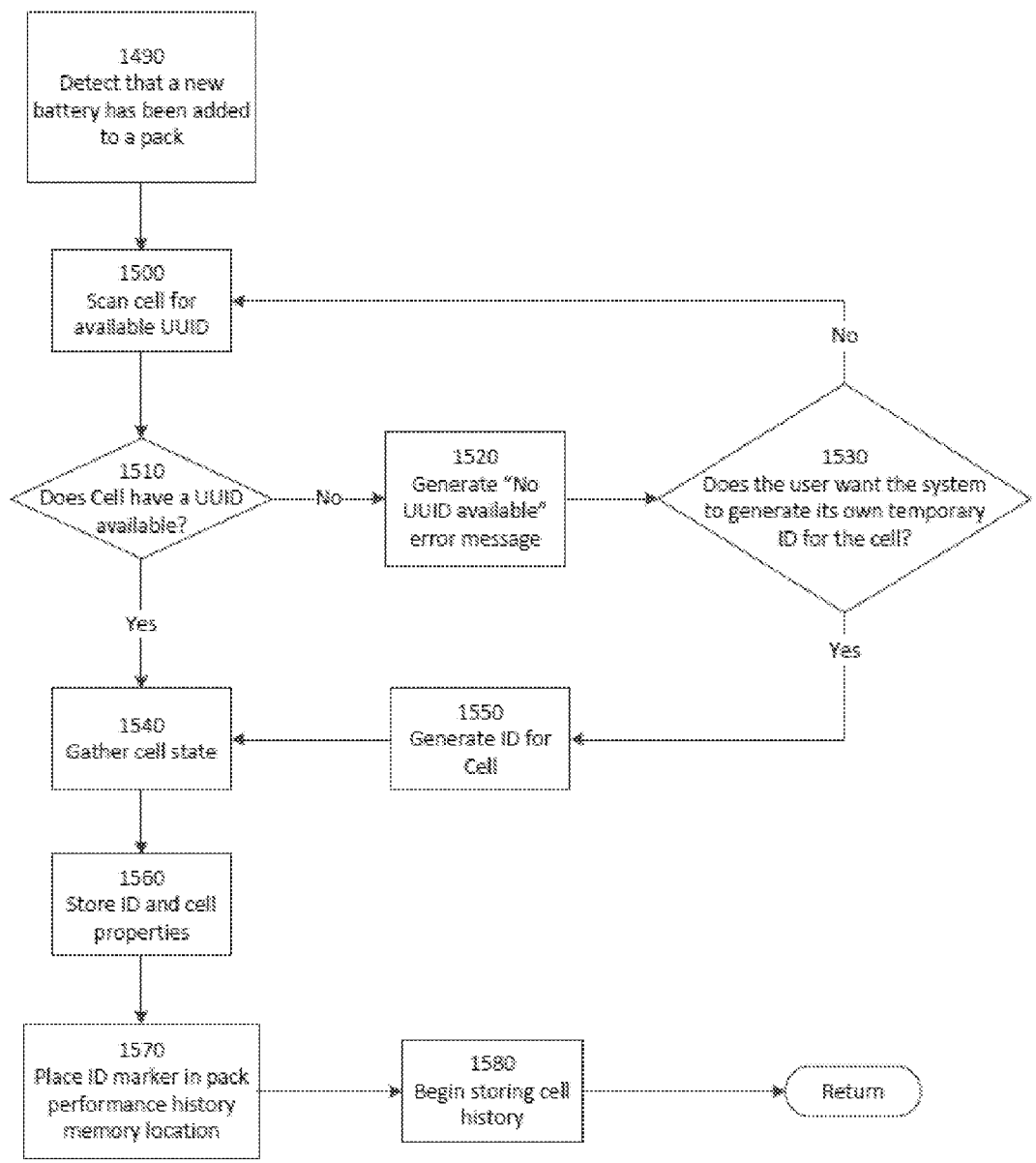
FIG. 7 (Assigning a Battery ID) is a diagram that depicts a procedure for identifying cell ID and generating temporary ID's if necessary.

FIG. 7 describes Assigning a Battery ID where 1490 describes the process being initiated by a process that detected a new battery (see FIG. 6). A controller will scan the battery for available battery ID information 1500 using a method such as Bluetooth or NFC to read information off of a location on the battery such as a wireless transponder or a smart battery memory location. 1510 is a decision block determining whether a battery ID was able to be retrieved. If the controller is able to retrieve battery ID information, the controller will then store the battery ID in memory 1560; however is not able to retrieve battery ID information, a controller will generate a predetermined error message 1520 for when a new battery is added and a controller can't retrieve any ID information from the battery. 1530 is a decision block which determines whether a controller should make another attempt to retrieve battery ID information or generate an ID for the battery. If a user or a predetermined portion of the controller program determines that controller should try to retrieve battery ID data again, the controller restarts the scan for available battery ID's 1500; however if it is determined that the controller will not assign as battery ID or try to retrieve battery ID data again, the a controller will generate an error message 1535; if it is determined that the controller will assign a battery ID, the controller will generate the ID 1550 and store the ID in memory 1560, 1570 describes the controller being able to save the battery ID in the pack performance history to mark when the battery was changes in the pack. The controller will then begin to store battery history as it becomes available 1500.

Figure 8:
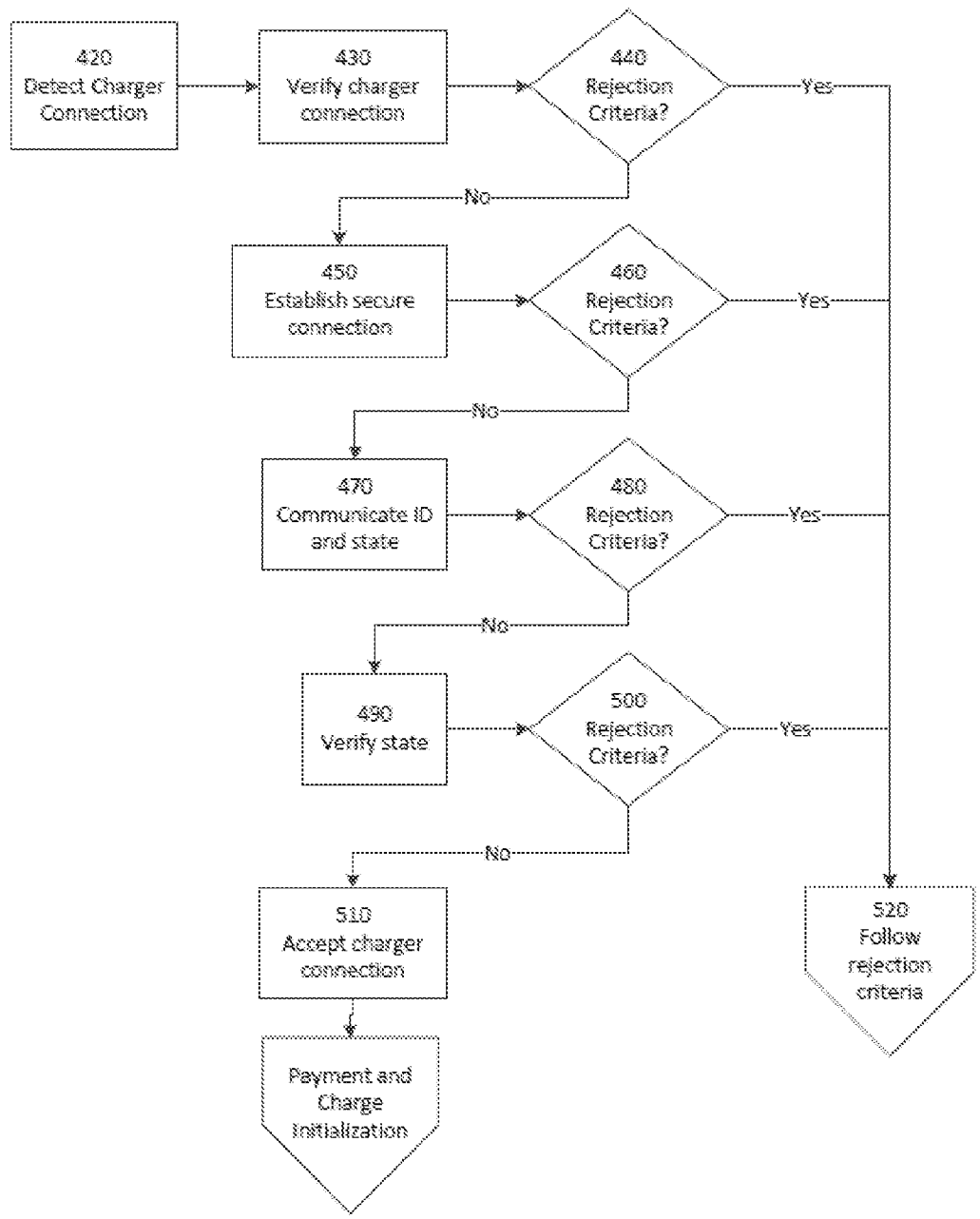
FIG. 8 (Connecting to a Charger) is a diagram that depicts a set of operations for connecting the HSC to a charging controller in the event that a charger is connected to the system.

FIG. 8 describes Connecting to a Charger where 420 describes the host controller detecting a charger capable a connecting to the system through a physical or wireless connection. The network connection as well as the power transfer from the charger can take place through a wired connection or a wireless connection such as wirelessly connecting to an induction charger for a wireless system charge. This system can be charged from a broad range of charging sources such as wall chargers, EV charging stations, induction chargers, wind turbines, solar panels, and energy conversion mechanisms such as regenerative breaking. The host controller then verifies that a charger is capable of connecting to the system 430 and determines whether the charger should be rejected based on predetermined rejection criteria 440. If the controller determines that the charger should be rejected, it acts on the rejection criteria protocol 520; however if the controller does not reject the charger at this point, the controller attempts to establish a secure connection with the charger 450. This secure connection may be wired or wireless (see fig FD11 for wireless connection protocol). After attempting to establish a secure connection with the charger, the controller determines whether the charger should be rejected based on predetermined rejection criteria 460. If the controller determines that the charger should be rejected, it acts on the rejection criteria protocol 520; however if the controller does not reject the charger at this point, the controller attempts to upload system ID and state information to the charger 470; then the controller determines whether the charger should be rejected based on predetermined rejection criteria 480. If the controller determines that the charger should be rejected, it acts on the rejection criteria protocol 520; however if the controller does not reject the charger at this point, the controller attempts to verify the current state of the power system and charger 490; then the controller determines whether the charger should be rejected based on predetermined rejection criteria 500. If the controller determines that the charger should be rejected, it acts on the rejection criteria protocol 520; however if the controller does not reject the charger at this point, the controller accepts the charger connection to the power system 510.

Figure 9:
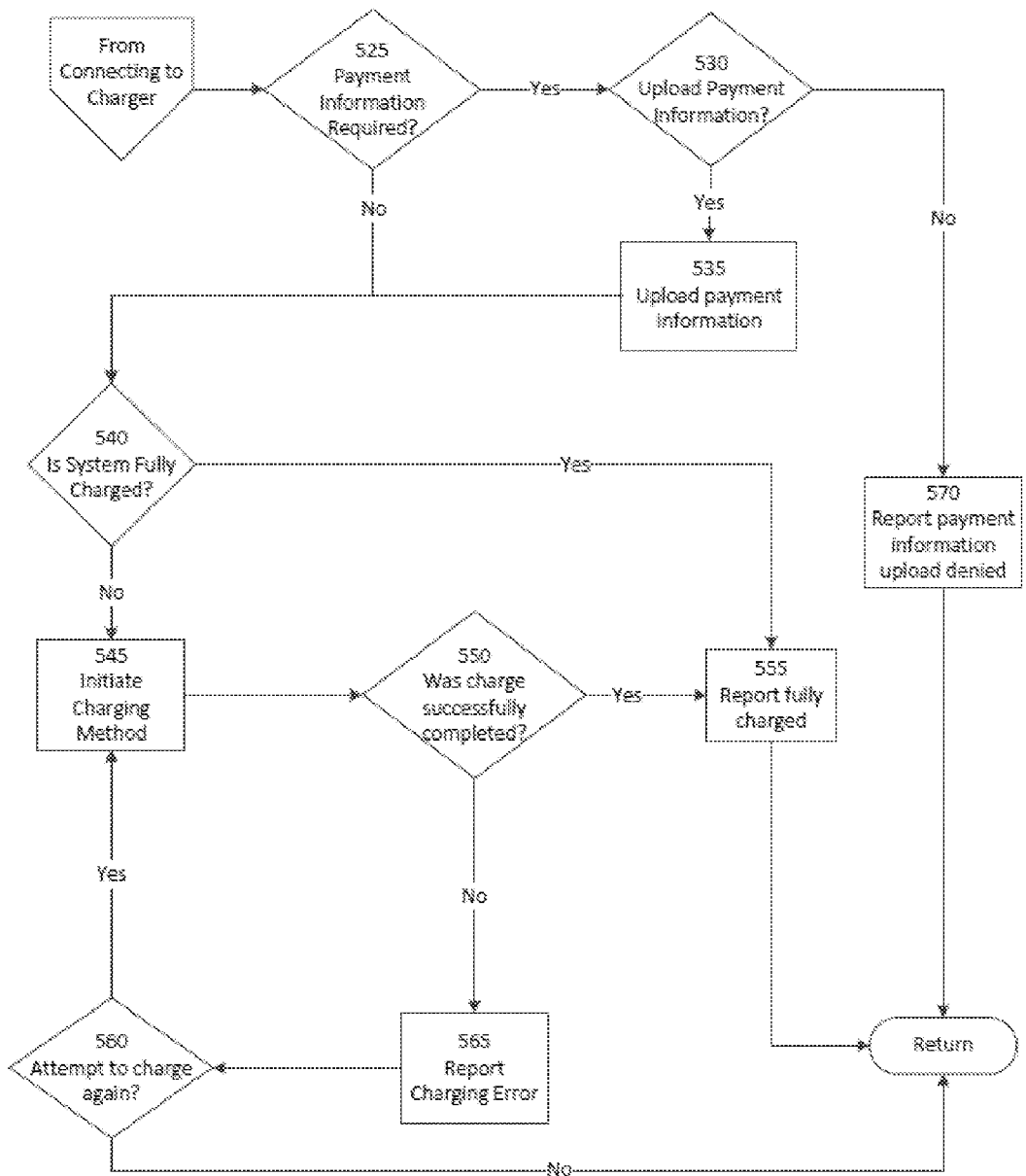
FIG. 9 (Payment and Charge Initialization) is a diagram that depicts the operations involved with paying in commercial charger applications.

FIG. 9 describes Payment and Charge Initialization where the host controller determines whether payment information is required by the charger 525. If payment information is required, the controller determined whether to provide payment information to the charger 530; this will likely be a choice that user either directly selects, or set criteria for when to allow upload for convenience; however if payment information is not required, the host controller determines if the system is fully charged 540. If payment information is required and the controller chooses to upload the payment information, predetermined payment information is uploaded to the charger 535; however if the controller doesn't allow payment information to be uploaded, the controller reports that payment information upload was denied and the system doesn't initiate charging 570. If the system is determined to be fully charged, the controller reports that the system is fully charged; however if the system is not fully charged, the controller begins the charging method 545 (see Fig FD20). 550 determines whether the system was successfully fully charged. If the system was fully charged, the controller reports that the system is fully dunged 555; however if the system was not successfully charged, the controller reports a charging error 565. In block 560 the controller determines whether another attempt should be made to charge the system. If it is determined that another attempt should be made, the charging method is started again 545; however if it is determined that another attempt should not be made, the controller exits the Connecting to Charger method.

Figure 10:
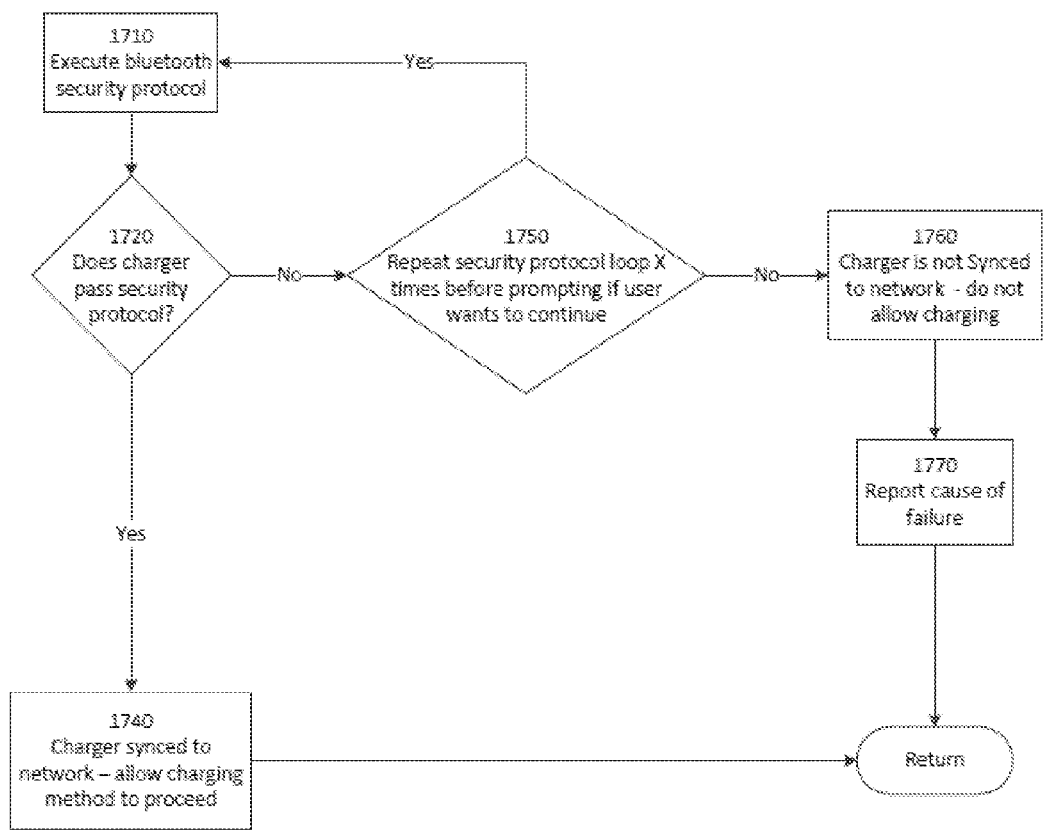
FIG. 10 (Wireless Connection Protocol—HSC to Charger) is a diagram that depicts the operations involved in securely connecting wireless transceivers between the HSC and a charger.

FIG. 10 describes a Wireless Connection Protocol for connecting the host controller to a charger where 1710 describes the host controller securely connecting to a charger using a secure connection standard such as Bluetooth, 802.11, or a wired serial or parallel connection. The host controller determines whether the secure connection was successful in 1720. If the secure connection is successful the host controller allows charging to proceed 1740; however if the secure connection is not successful, the host controller will determine if it should attempt another secure connection with the charger 1750. If the host controller determines it should make another attempt to securely connect with the charger, the secure connection 1710 is attempted again; however if the controller doesn't make another attempt to connect to the charger, the controller does not allow charging 1760, and reports the cause of failure 1770.

Figure 11:
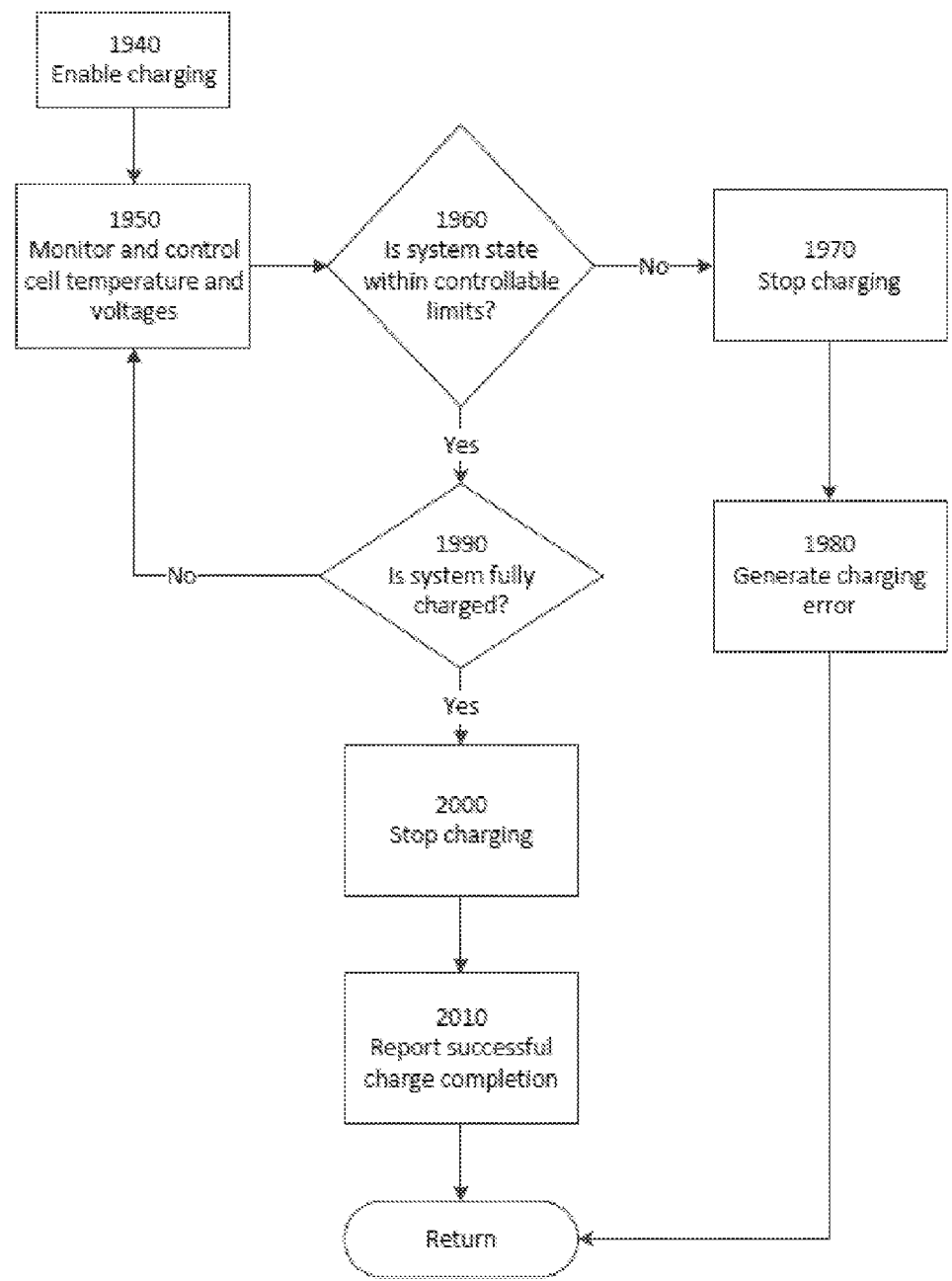
FIG. 11 (Charging) is a diagram that depicts a standard procedure for safely charging cells in the system.

FIG. 11 describes a method for Charging where 1940 describes the host controller allowing power to flow to the one or more packs in the system. The host and local controllers monitor and control the voltage and current entering each battery, as well as predetermined battery characteristics, in such a way that the batteries can be optimally charged using solid state control methods 1950. The controllers determine if the system state, such as individual battery temperature and voltage, are within the predetermined limits of that the controllers can handle 1960. If the system is not within controllable limits, the host controller stops allowing the system to charge 1970 and generates a charging error 1980; however if the system is within controllable limits, the host controller determines if the system has been fully charged 1990. If the system has not been fully charged the controllers continue to monitor and control the voltage and current entering each battery 1950, however if the system is fully charged, the host controller stops allowing the system to charge 2000 and reports successful charge completion 2010.

Figure 22:
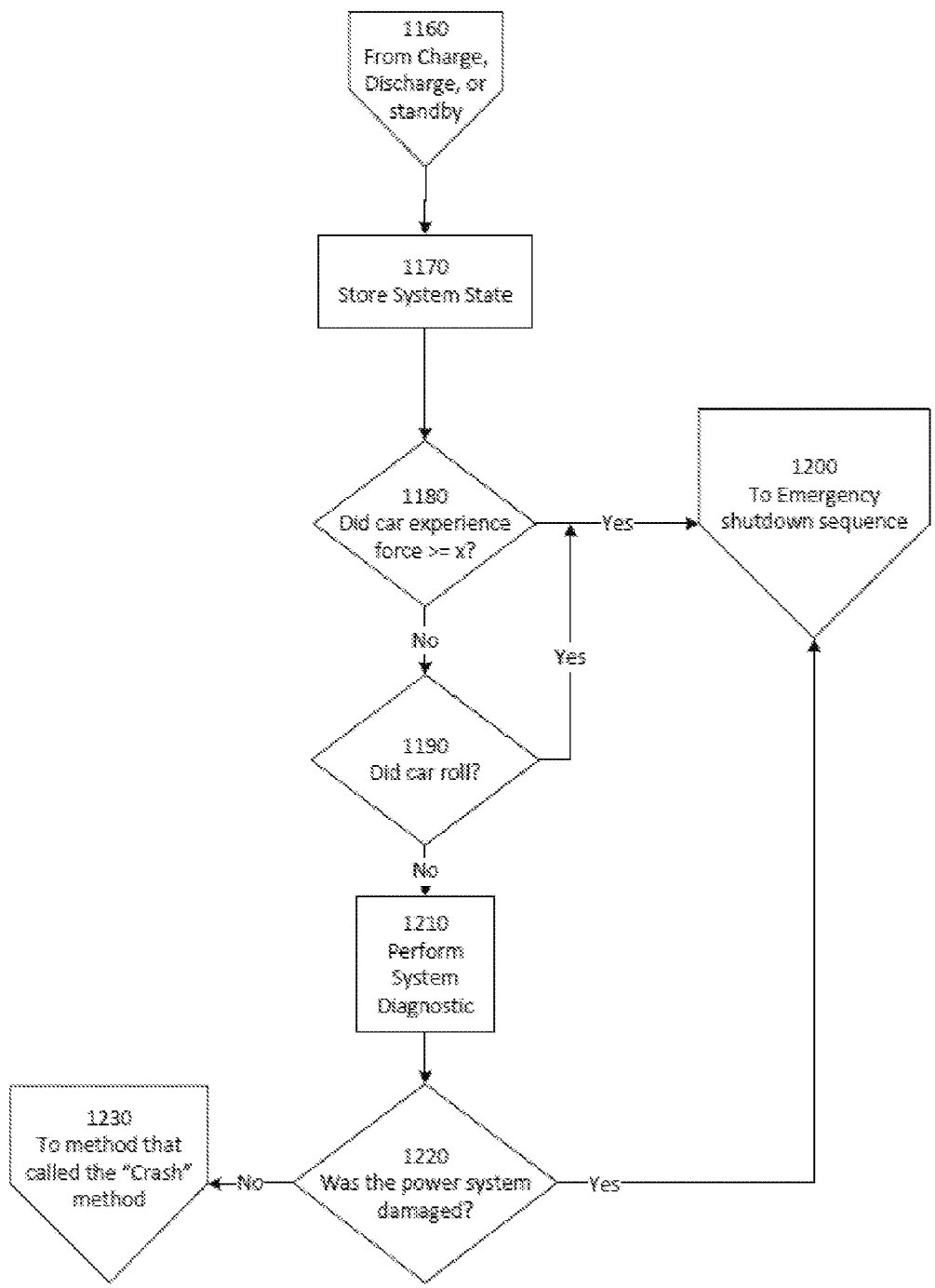
FIG. 22 (Crash Scenario) is a diagram that depicts a set of safety measures followed in the event that the system has experienced forces outside of safe operational bounds and is possibly damaged.

FIG. 22 describes Discharging/Loading where 330 detects that a load device is connected to the system that will require energy to operate. 332 determines whether system discharge has been enabled. If discharge is currently not allowed 334, the host controller reports that discharge is disabled; however if discharge is allowed 340, the host controller detects and determines the energy requirements of the load. The controllers determine whether the power system has suitable power and system health to support the load 350. If the power system has suitable power and health, the host controller allows discharge to support the lead 360 while monitoring the power system 370; however if the host controller determines that the power system does not have suitable power to support the load, the host controller reports that the power system cannot support the load due to incompatible load capabilities or insufficient system charge 380; if the host controller determines that the power system does not have suitable health to support the load, the host controller will report the health issue 400 and attempt to initiate health state control 410.

Figure 13:
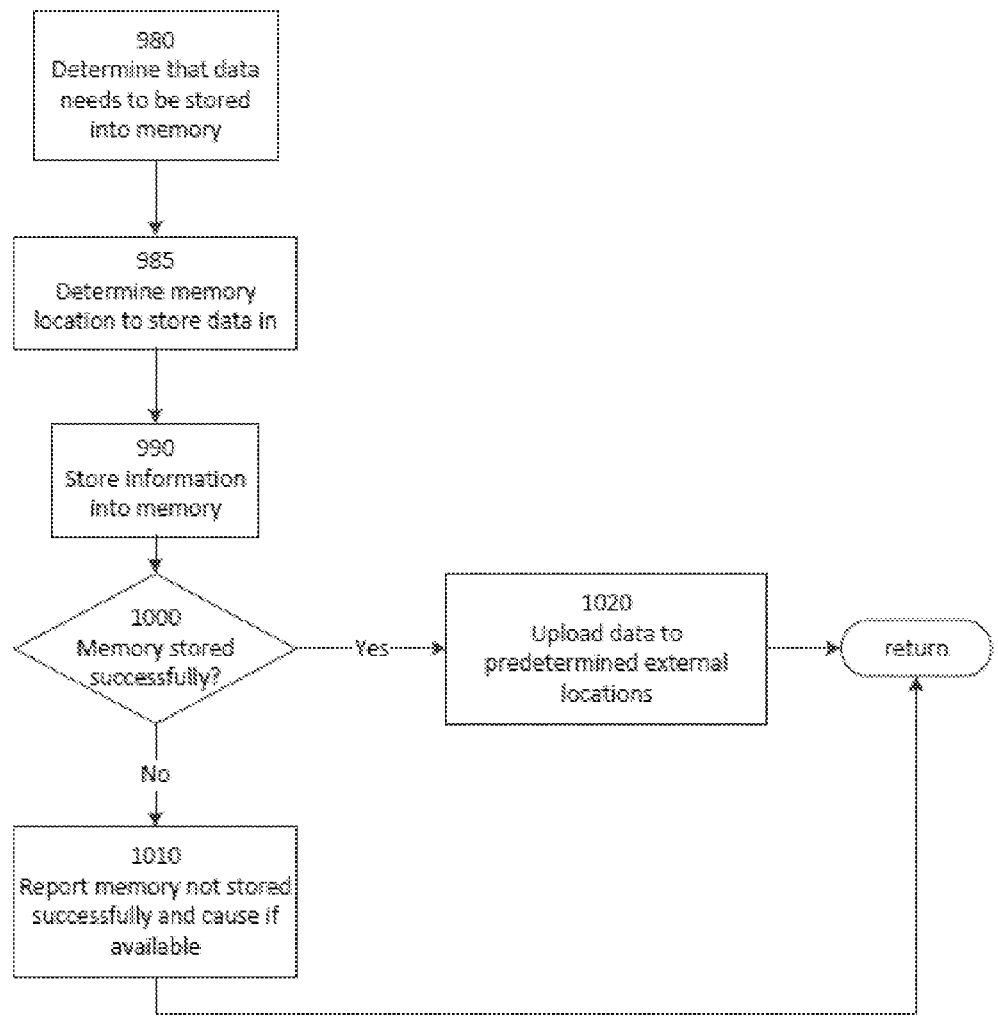
FIG. 13 (Storing Memory) is a diagram that depicts a process for storing memory on the HSC and LPC.

FIG. 13 describes a method for Storing Memory where 980 describes a controller determining that there is data relevant that reeds to be stored. 985 determines where to store the data. In 990 the information is stored, with any relevant ID's, into the chosen memory location. In 1000 the controller determines if the memory was successfully stored. If the memory was not stored successfully, the controller reports that information was not successfully stored in memory 1010; however if the memory is successfully stored, the controller will attempt to upload the information in memory to one or more predetermined external locations when appropriate 1020.

Figure 14:
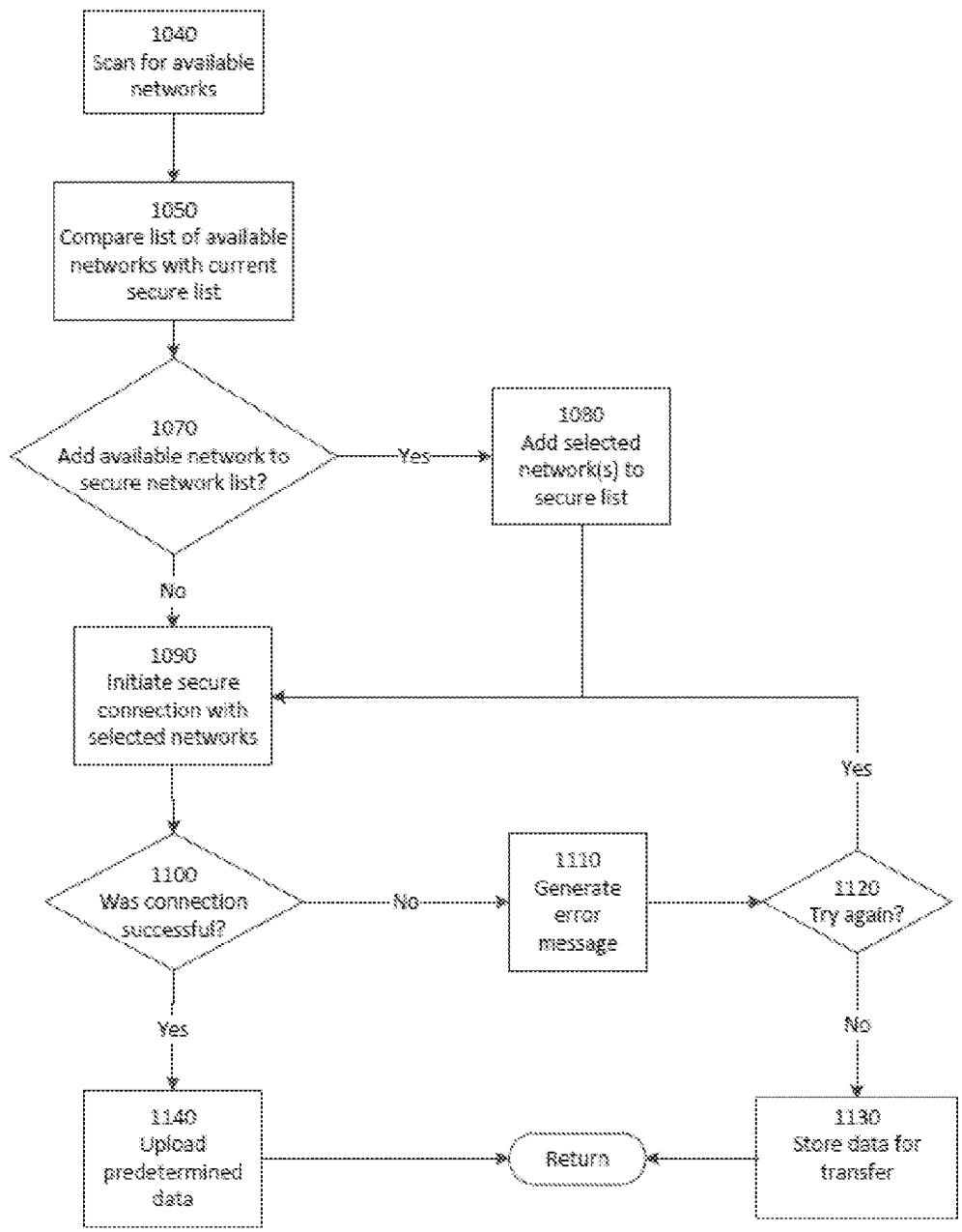
FIG. 14 (Remote Network Uplink) is a diagram that depicts a sequence of operations which can be used by the system for connecting and transmitting information to remote wireless networks.

FIG. 14 describes a method for uploading data to a remote network where 1040 describes the host controller scanning for available networks. Available networks may be wired or wireless and may include networks such as Bluetooth, NFC, 802.11, ZigBee, and wired networks. In 1050 the host controller compares the available list of networks with a secure list of networks which the controller already has permissions to connect to. 1070 represents a decision block where a user or the host controller will determine whether to add zero or more of the available networks to the list of networks to try to connect to. If it is determined that any networks should be added to the list, the networks are added 1080 and then the host controller attempts to connect to the available networks on the list 1090; however if it is determined that the host controller should not add any new networks to the list, it attempts to connect to connect to available networks on the list 1090 without adding any networks first. In 1100 the host controller determines whether the connection to a network is successful. If the connection is successful, the controller uploads predetermined data to the remote location 1140; however if the connection to a network is not successful, the controller generates an error message 1110 and determines whether it should try to connect to that network again 1120. If the user or controller determines that another attempt should be made to connect to the network, it attempts to connect to the network again 1090; however if it is determined that another attempt should not be made to connect to a network, the relevant data is stored for future transfer 1130.

Figure 15:
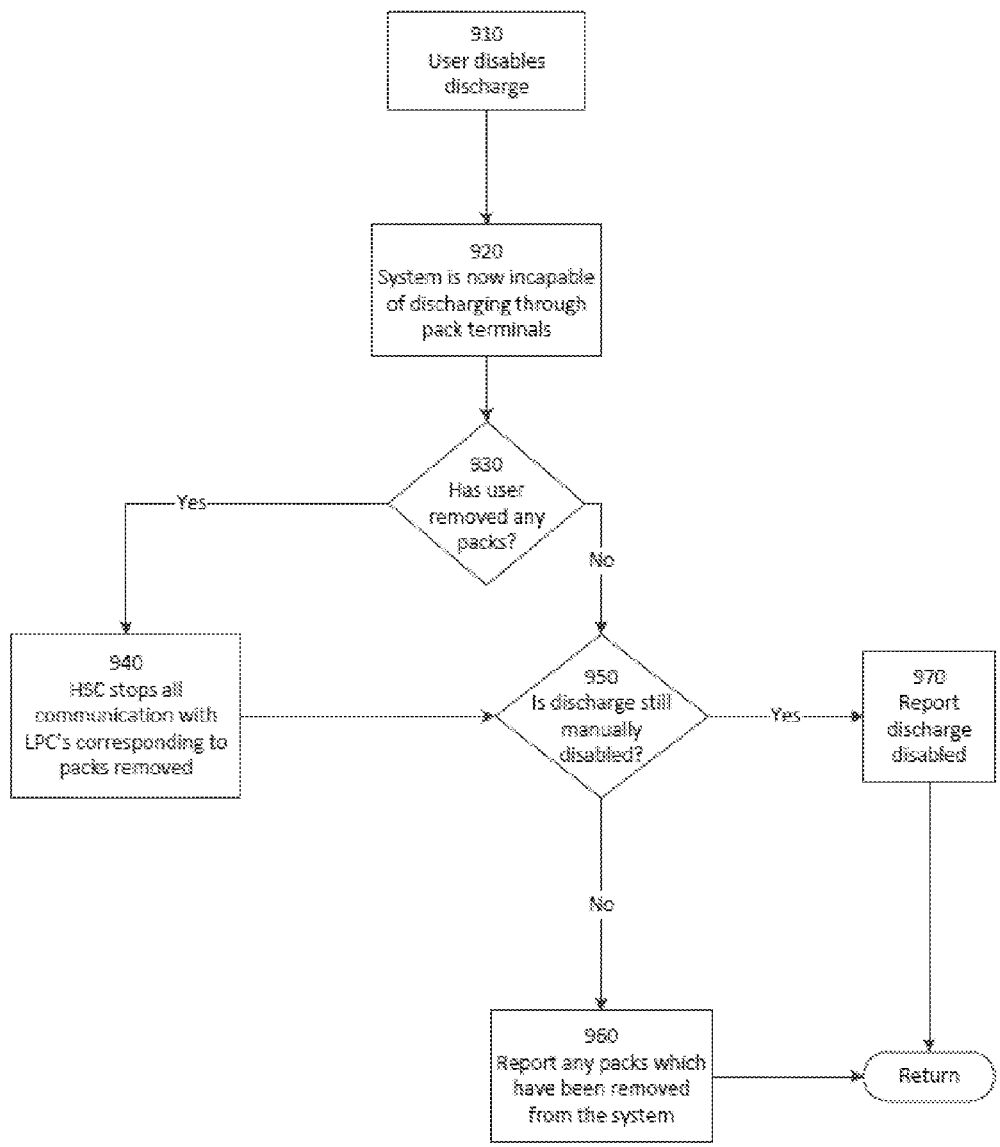
FIG. 15 (Removing a Pack from a Network) is a diagram that depicts a set of operations for safely removing a pack from the system.

FIG. 15 describes a method for Removing a Pack from the Network where 910 describes the user disabling the discharge in the system. 920 describes that the system is now incapable of discharging through pack terminals. 930 determines whether the user has removed one more packs from the system. If no packs have been removed, the host controller determines whether discharge is still manually disabled 950; however if one or more packs have been removed, the host controller stops communicating with the controllers on the removed packs 940 before determining whether discharge is still manually disabled 950. If system discharge is manually disabled, the host controller reports that discharge is manually disabled 970; however if discharge is no longer manually disabled, the host controller reports that discharge is not manually disabled and reports any packs that have been removed from the system 960.

Figure 16:
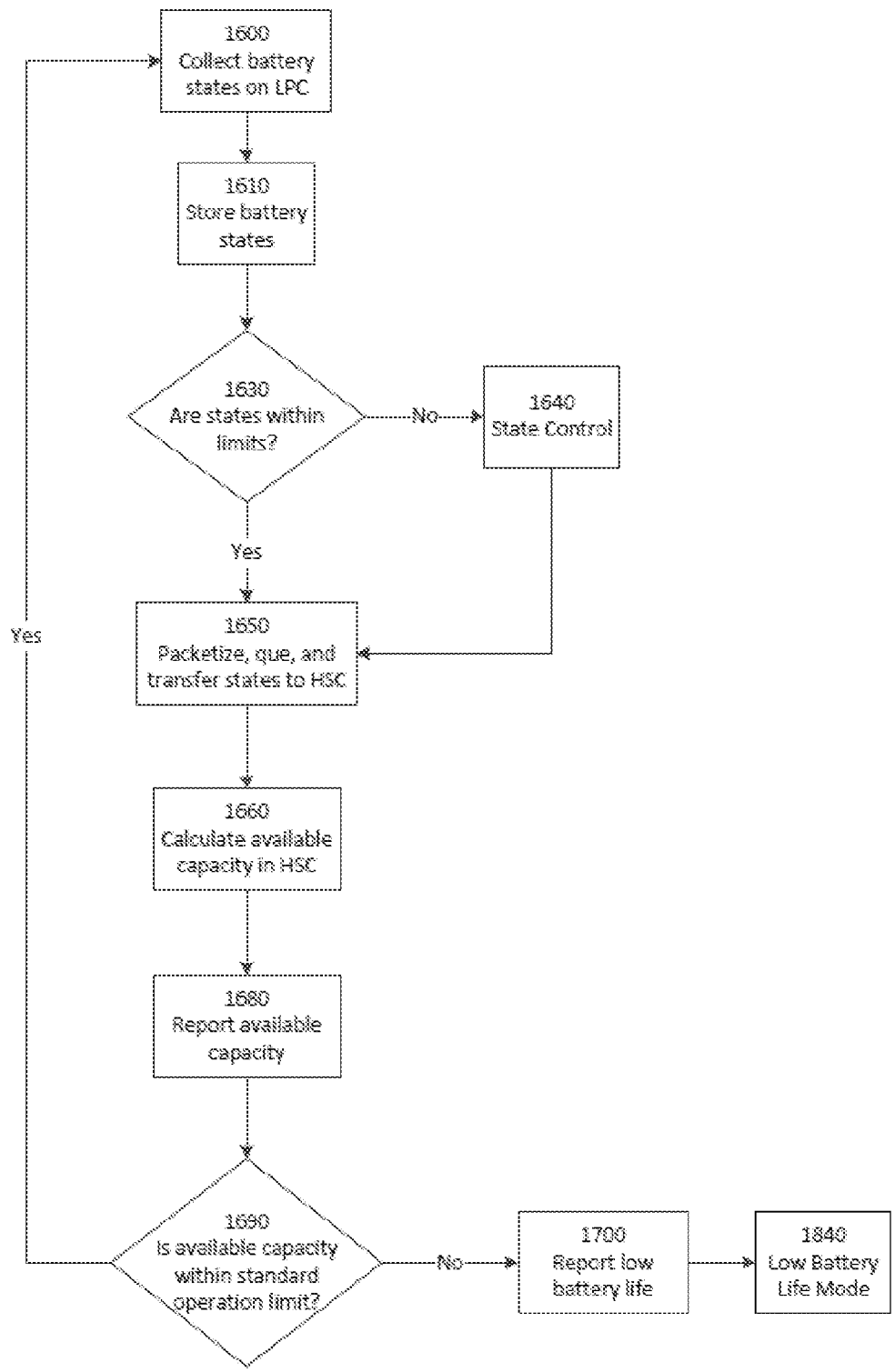
FIG. 16 (System Monitoring) is a diagram dial depicts a process for continuously analyzing the state of the system and initiating state control measures when necessary.

FIG. 16 describes System Monitoring where 1600 describes local controllers collecting state information for their respective packs. State information may comprise information such as system voltage, current, temperature, vibration rate and amplitude, and battery impedance across a range of frequencies which can be determined using a method such as electrochemical impedance spectroscopy (EIS). This information is stored in memory 1610 using memory storage protocol (see FIG. 13). 1630 determines whether the system state is within predetermined limits, if the system is within predetermined limits, relevant information is packetized and uploaded to the host controller 1650; however is the system is not within predetermined limits state control is initiated 1640 such as controlling temperature or redistributing load across available batteries in the system, before preparing and sending data to the host controller 1650. In 1660 the host controller calculates the available power capacity in the power system. In 1600 the host controller reports the available system power capacity. In 1690 the host controller determines whether the power system has power capacity within a predefined limit compared to the requirements of the system load. If the system has suitable power capacity, the local controllers begin collecting battery state data 1600 again; however if the system does not have suitable power capacity, the host controller reports low battery life 1700 and initiates a low battery life mode 1040 (sec FIG. 20).

Figure 17:
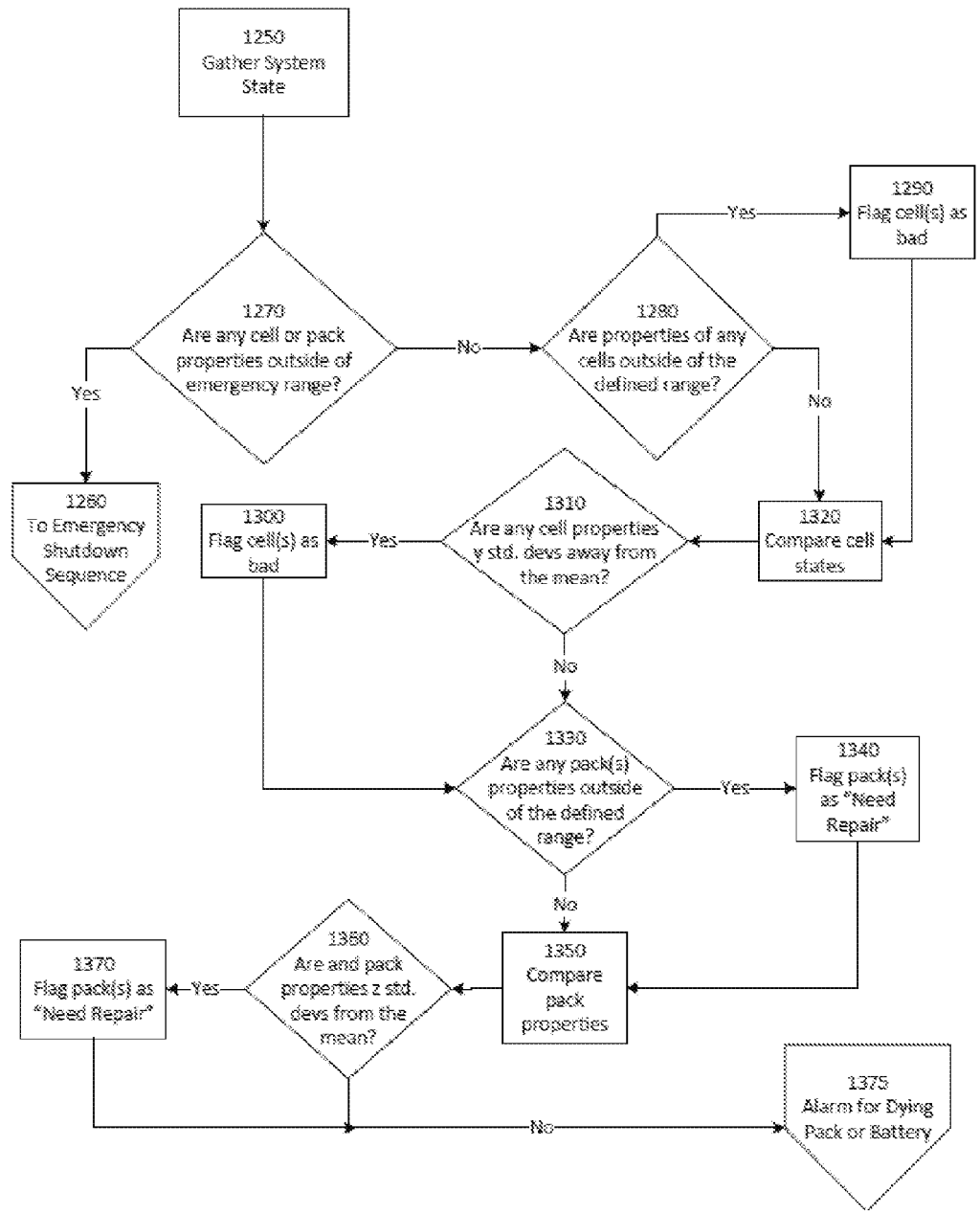
FIG. 17 (Bad Pack or Battery) is a diagram that depicts a set of diagnostic procedures for identifying a bad pack or cell to the user.

FIG. 17 describes a method for determining whether there is a Bad Pack or Battery in the power system where 1250 describes the host controller gathering relevant data to determine the current state of the system. 1270 determines whether any battery or pack properties are outside of a predetermined emergency range for the system. If any battery or pack properties are outside of the emergency range, the host controller initiates an emergency shutdown sequence 1260; however no properties are outside of the emergency range, the host controller determines whether any battery properties are outside of a defined healthy range 1280. If no batteries are outside of the healthy range, the controller compares the battery states 1320; however if any batteries are outside of the healthy range, the controller flags those batteries 1290 before comparing battery states 1320, 1310 determines whether any battery properties are too far from the battery average for that property. If no batteries are significantly different from the others, the host controller determines if any pack properties are outside of a defined healthy range 1330; however if any batteries are significantly different from the others, the batteries that are different are flagged 1300. If any packs have properties outside of the healthy range, those packs are flagged 1340; however if no packs have properties outside of the healthy range, the pack properties are compared against each other 1350, 1360 determines whether any packs have any properties which are significantly different than the average of the packs. If any packs have properties that are significantly different than the others, the pack(s) are flagged 1370; however if none of the packs have any properties that are significantly different than the others, the host controller initiates the Alarm for Dying Pack or Battery method 1375 (See FIG. 21).

Figure 18:
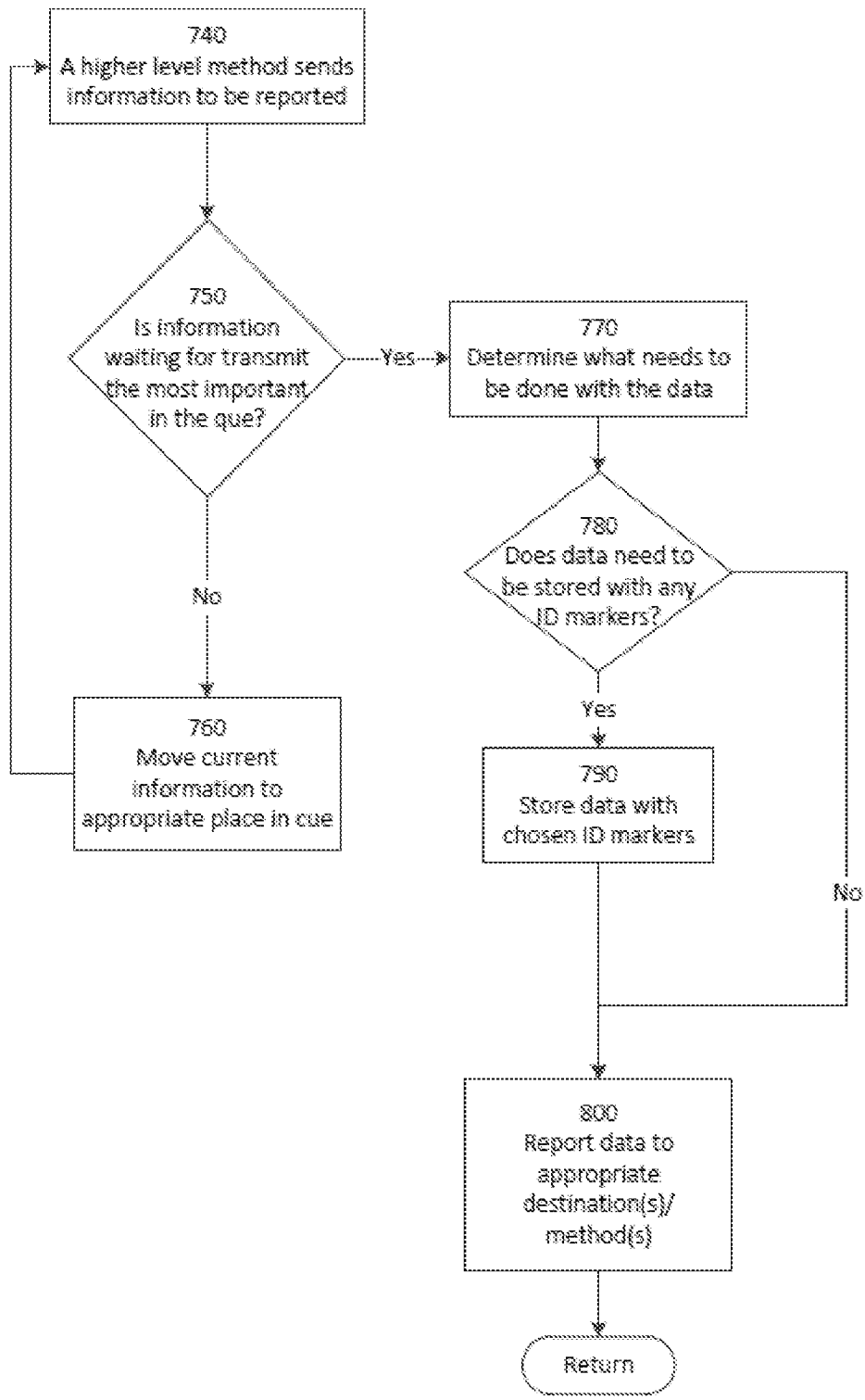
FIG. 18 (Report Function) is a diagram that depicts a sequence of operations used to transmit information such as warnings and system status from the HSC to interfaces, external networks, etc. . . .

FIG. 18 describes a method for a Report Function where 740 describes a higher level method sending information which needs to be reported. 750 determines whether a set of data is the most important data set in que to be reported. If the data set is the most important in the que, the host controller determines what needs to be done with the data set 770; however if the data set is not the most important in the que, the host controller moves the data set to an appropriate place in the que based on priority 760, 780 determines whether the data needs to be stored with a specific ID marker. If yes, The data is stored with the chosen ID markers 790; however, if no ID marker is needed, the host controller reports the data set to the one or more appropriate destinations 800.

Figure 12:
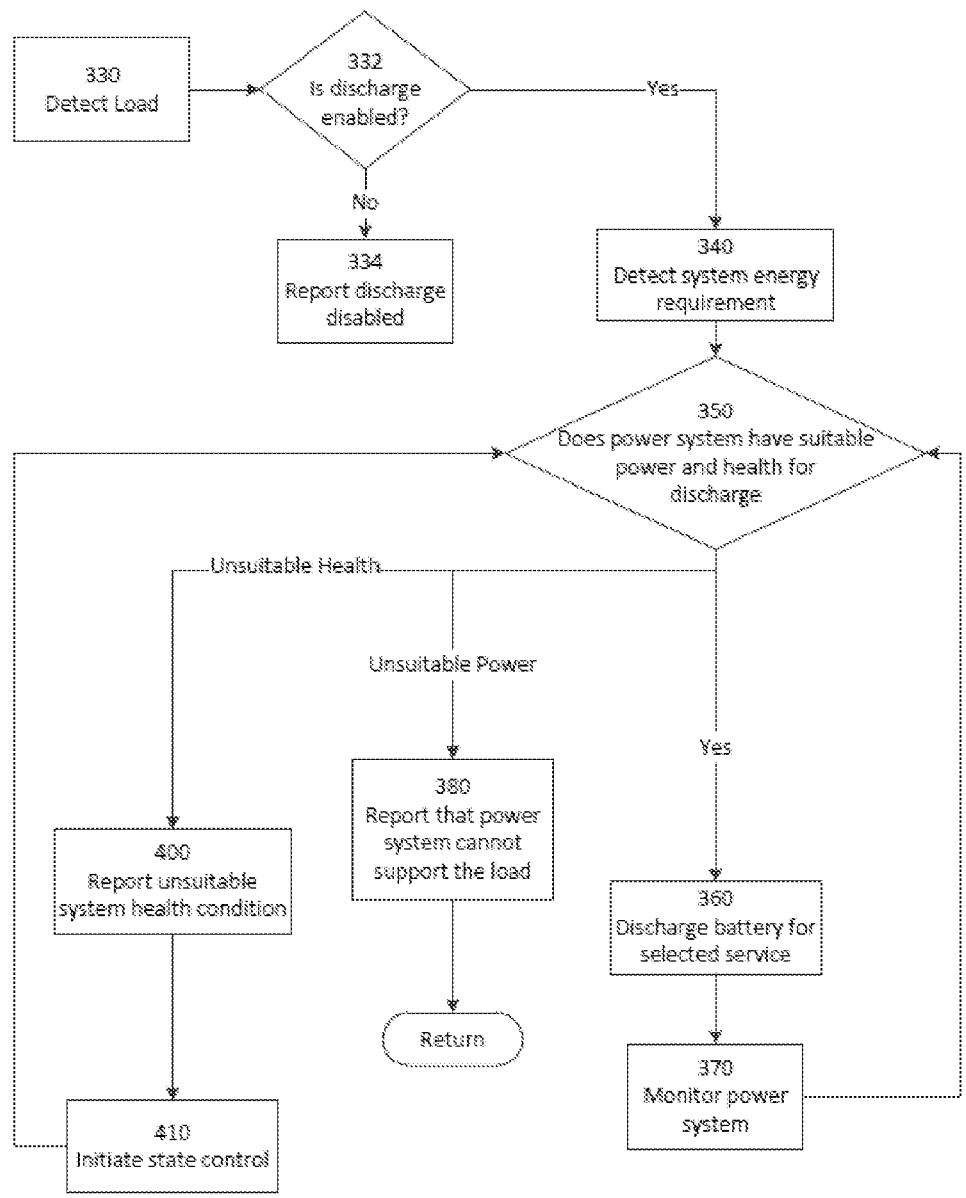
FIG. 12 (Discharging and Loading) is a diagram that depicts the operations required for the system to safely supply power.
Figure 19:
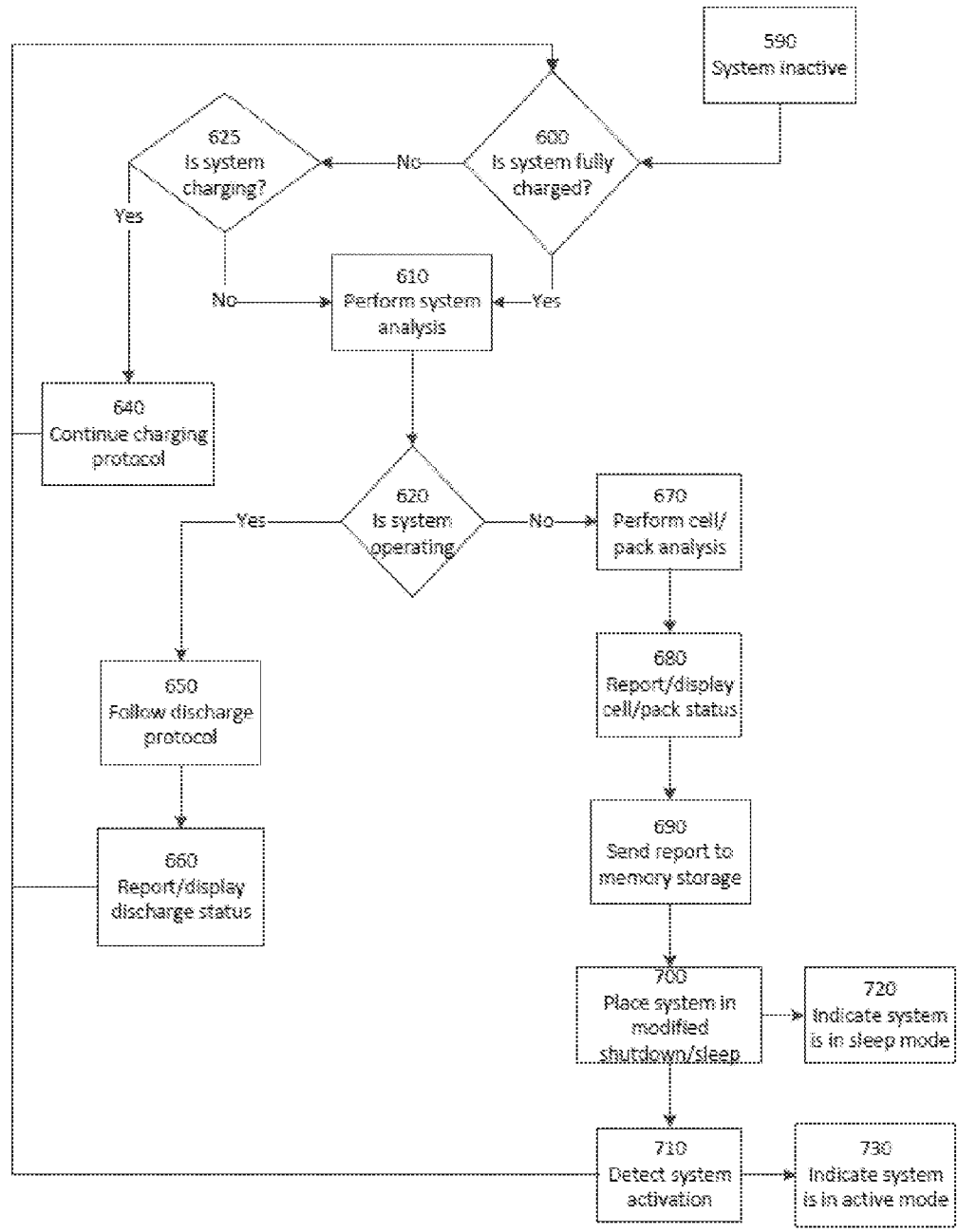
FIG. 19 (Sleep Mode) is a diagram that depicts power saving methods and a reduction of operations used to save power when stored power is not being used.

FIG. 19 describes a method for placing the power system into a Sleep Mode where 590 detects that the system has been inactive for a predetermined period of time. 600 is a decision block which determines whether the system is fully charged. If the system is fully charged, the HSC performs a system analysis 610; however if the system is not fully charged 625, the HSC determines whether the system is charging. If the system is charging 640, the HSC continues the system charging protocol (see FIG. 11); however if the system is not charging 610, the HSC performs a system analysis. Block 620 determines if the system should be following the discharge protocol instead of the sleep mode protocol. If the system is supplying power to an external device, the controllers follow the discharge protocol 650 (see FIG. 12) and report or display the system discharge status as necessary 660; however if the system does not need to actively discharge, the controllers perform an analysis of packs and batteries within the system 670. The controllers report the system status 680, store it in memory 690, and then place the system into a low power sleep mode 700, 720 describes the system indicating that it is currently in sleep mode. 710 describes the controllers detecting that the system has been activated. 730 describes the system indicating that it is now in an active mode.

Figure 20:
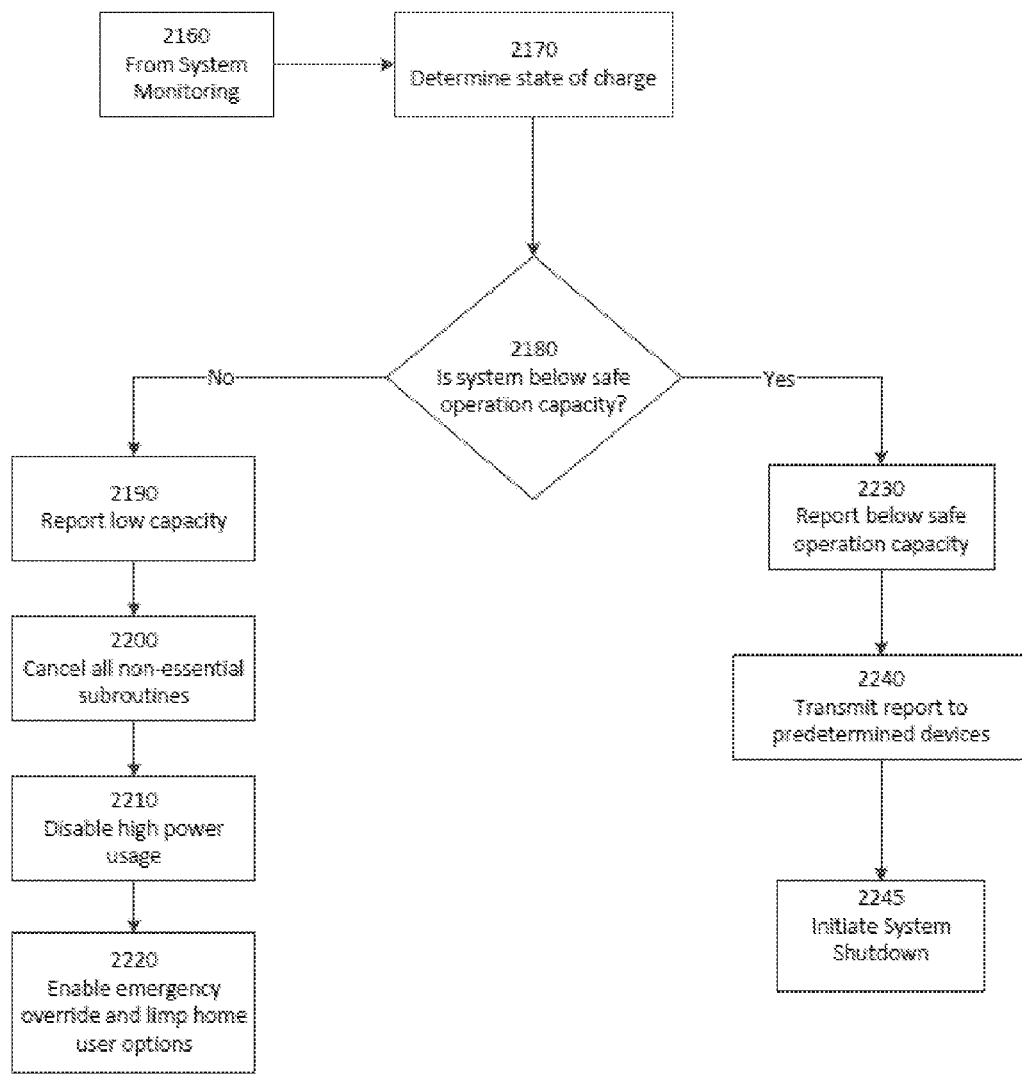
FIG. 20 (Low Battery Life Mode) is a diagram that depicts a procedure for managing the system while it is in a state of low power.

FIG. 20 describes a Low Battery Life Mode method where 2160 describes the method being initiated by the System Monitoring method (see FIG. 16) when the system power capacity drops below a predetermined limit. The host controller determines the remaining system capacity 2170 and determines whether the capacity is below a predetermined safe operation level 2180. If the system is below the safe operation limit, the host controller reports that the system is below safe operation capacity 2230 and transmits the report to predetermined internal and external devices 2240 before initiating a system shutdown 2245; however of the system is not yet below the safe operation capacity, the host controller reports that the system has low capacity 2190, cancels all non-critical operations 2200, disables high power discharge 2210, and gives the user the option to enable an emergency override or low-power operation with decreased system performance 2220.

Figure 21:
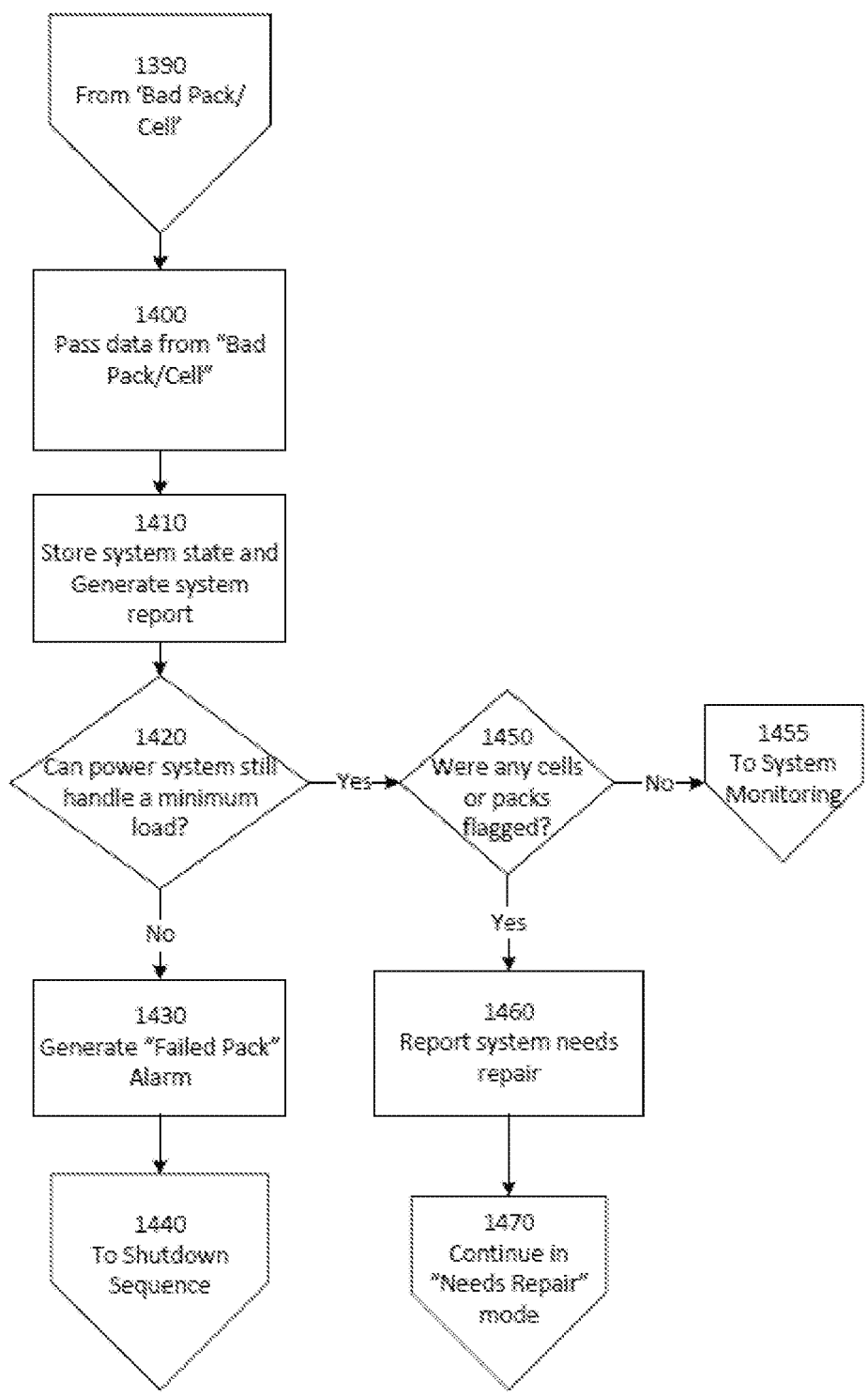
FIG. 21 (Alarm for a Dying Pack or Cell) is a diagram that depicts a process for alerting users of a pack or cell with a critically low power level.

FIG. 21 describes an Alarm for a Dying Pack or Battery method where 1390 describes this method being initialized by the Bad Pack or Battery method (see FIG. 17). 1400 describes this method gaining access to the data from the Bad Pack or Battery (FIG. 17) method. The host controller stores the system state and generates a system report 1410 before determining whether the power system can still handle a minimum load necessary to support the one or more devices currently being powered 1420. If the system cannot handle the necessary minimum load, the host controller reports that the system is failing 1430 and begins to shut down 1440; however if the system can still handle a minimum load, the host controller determines if any batteries, or packs are currently flagged 1450. If no batteries or packs are flagged 1455, the method exits back to the System Monitoring method (see FIG. 16); however if any of the batteries or packs were flagged, the host controller reports that the system needs repair 1460 and initiates a discharge mode with decreased performance and limited functionality to minimize system load until the system is repaired 1470.

FIG. 22 describes a Crash Scenario method where 1160 describes this method being suddenly called from an active or standby mode due to a sensor such as an accelerometer measuring a system abnormality such as a sudden impact. The host controller stores all available information into memory 1170 and determines whether the system experienced a sudden force greater than a predetermined limit 1180. If the vehicle experienced a sudden force above the set limit, the host controller initiates an emergency shutdown sequence 1200; however if the system did not experience a force greater than the set limit, the host controller determines whether the vehicle has rolled 1190. If the vehicle has rolled, the host controller initiates an emergency shutdown sequence 1200; however if the vehicle did not roll, the host controller performs a system check to determine the state and health of the system 1210, 1220 determines whether the power system was damaged. If the system was damaged, the emergency shutdown sequence is initiated 1200; however if the power system was not damaged, the method returns control to whichever method was running when it was called 1230.

Figure 23:
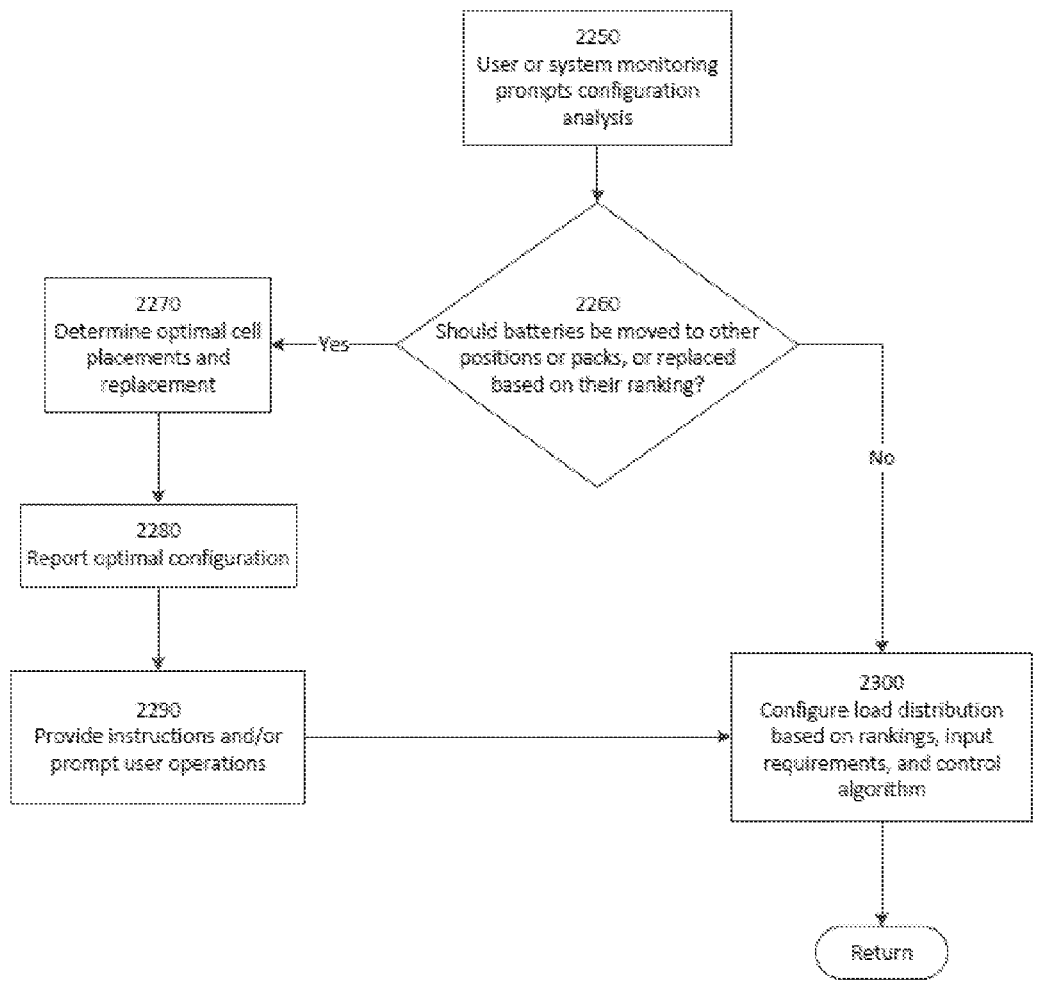
FIG. 23 (Battery Configuration) is a diagram that depicts a method for configuring and ranking cells based on their performance and specifications.

FIG. 23 describes a Pack Configuration method where 2250 describes the user or a monitoring method initializing the Pack Configuring method 2260 determines whether any batteries should be moved to another position or packs, or whether one or more batteries should be replaced based on their health ranking. If no batteries should be moved or replaced, the controllers configure the load distribution based on rankings, input requirements, and system control algorithms 2300; however if one more batteries should be moved or replaced, 2270 determines the optimal battery placement and which batteries should be replaced. 2280 reports the optimal configuration and 2290 provides configuration instructions to the appropriate systems or a user. After configuration 2300 the method ends.

Figure 24:
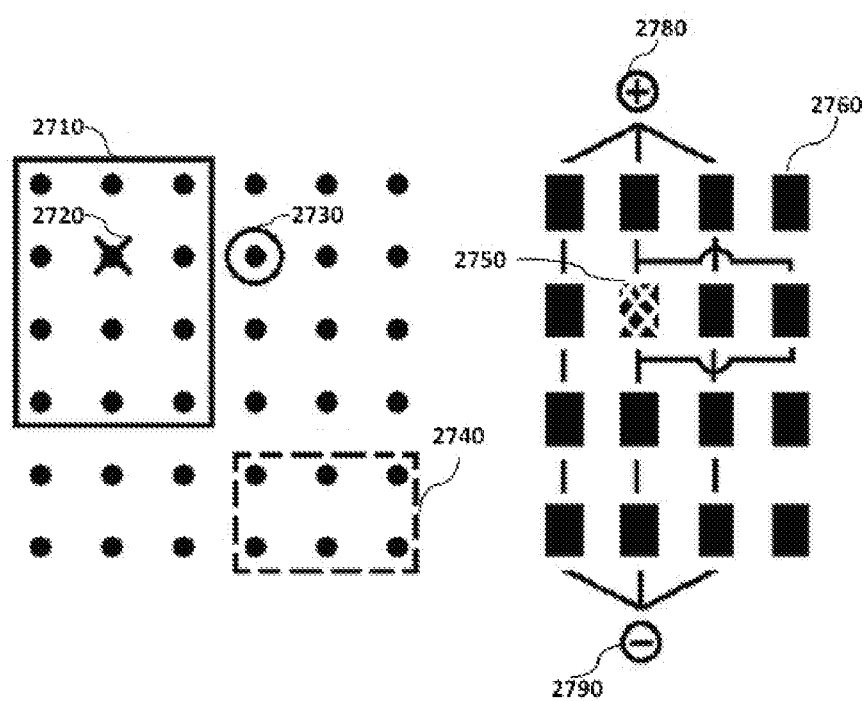
FIG. 24 (Dynamic Cell Matrix) is a diagram that depicts a method for dynamically configuring the cells in the system to fit output requirements.

FIG. 24 shows a Dynamic Cell Matrix which allows for a wide range of cell configurations, outputs, and other options. In this matrix, the connection coming from one cell can be altered to connect to other batteries in the system. A grouping of these batteries used to produce an output will be called a set for clarity. Primary 2710 and auxiliary 2740 sets configured into a single system are shown in FIG. 24. The primary set 2710 shows a configuration drawing power from 12 batteries with 3 parallel lines each with 4 batteries in series. Primary terminals 2780 and 2790 can be designated for the primary set and auxiliary terminals for the auxiliary set. There may be multiple auxiliary sets and there is no limit to the size of each set. This set also depicts the scenario in which a cell has gone bad and it is replaced by rerouting 2750 the connections of the adjacent cells to a cell that was not in use. In some systems a number of spare batteries 2760 may be designated solely for this purpose. This rerouting is done by a switch controlled by the LPC or HSC. This switch may be any type of mechanism used to alter the connection in a circuit, such as an electromagnetic relay.

Figure 25:
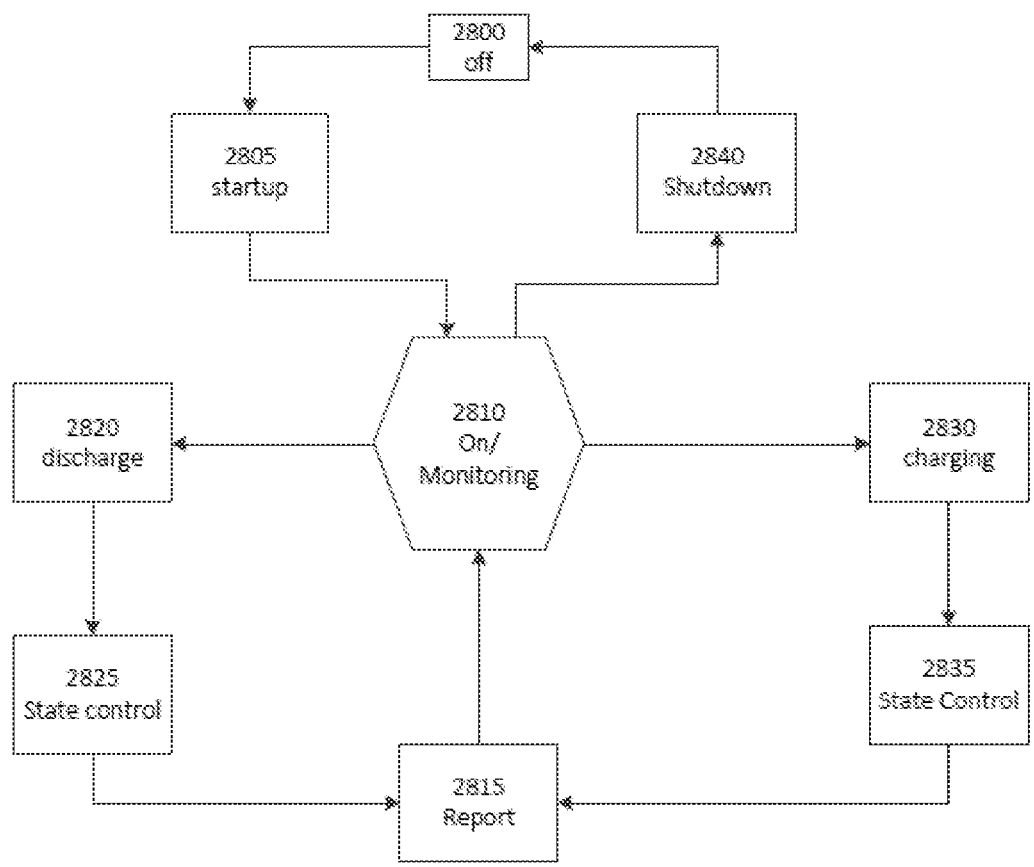
FIG. 25 (Parent Tree of Operations) is a diagram that depicts how each process interacts with the others. This tree assumes the standard operations necessary for the system to function and that all packs have been fully connected to the system.

FIG. 25 describes a Parent Tree for Standard Operation where 2800 represents the power system in an inactive mode. The system goes through a startup sequence 2805 and moves into an 'on' mode where the controllers are monitoring the system 2810, 2820 describes the system following discharge protocol. 2825 describes the system controlling the state of the system such as cooling overheated batteries and redistributing the required load across available batteries and packs. 2015 describes the controllers reporting the current state of the system. 2830 describes the system charging 2835 represents controllers controlling the state of the system while charging 2840 describes the system shutting down.

Figure 26:
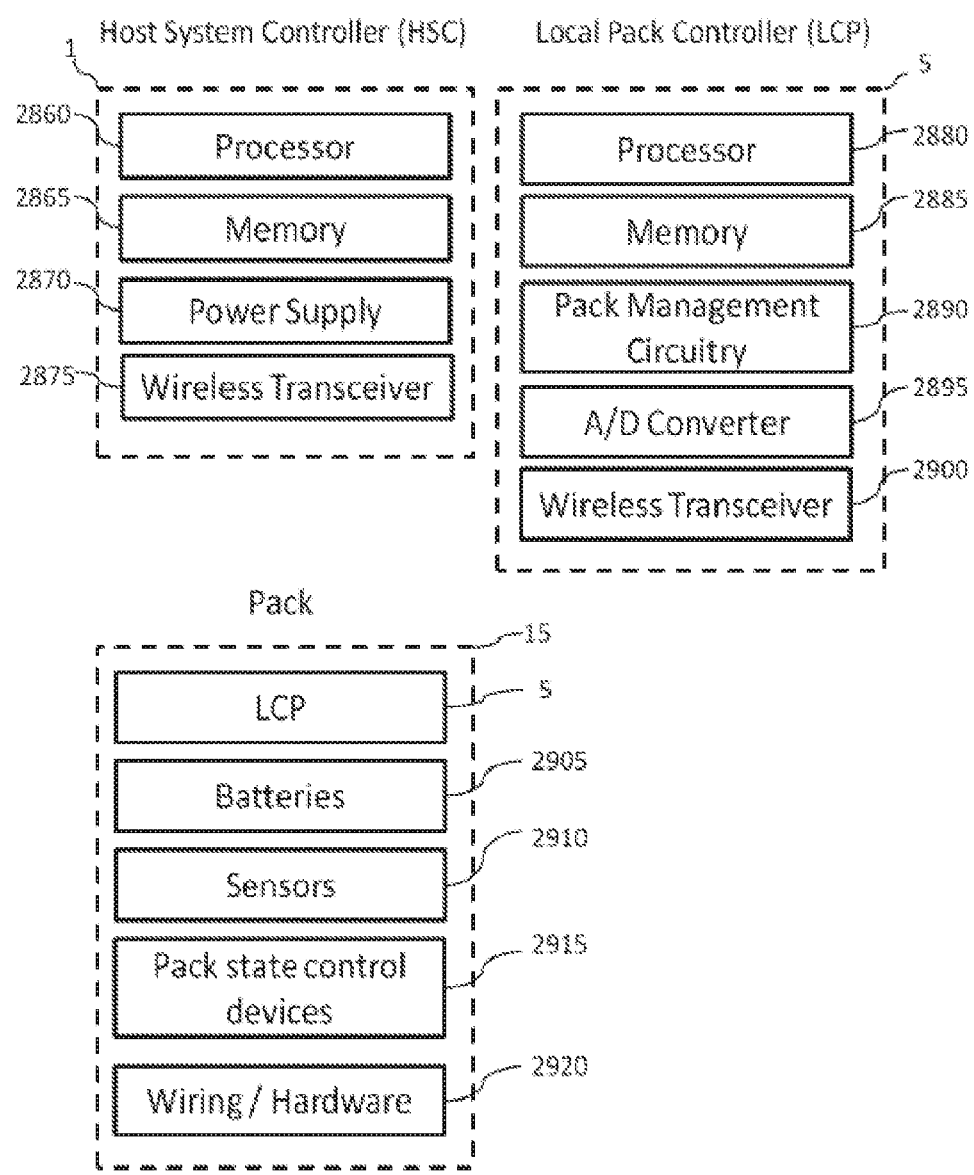
FIG. 26 (System Components Overview) is a diagram that depicts the general overview of the components inside the power system.

FIG. 26 shows a System Components Overview of the power distribution control system where 1 is the host system controller (HSC), 5 is the local pack controller (LPC), and 15 is a pack within the system. The HSC 1 contains one or more processors 2860 with non-volatile flash memory 2865 and a wireless transceiver 2875 connected to the one or more processors 2860, and with a power supply 2870. The power supply 2870 may come from one or more of several possible sources, such as an onboard battery or capacitor, power supplied directly from one or more system packs 15, or power supplied from the electronics system that the packs are supplying power to. The LPC 5 contains one or more processors 2880 with non-volatile flash memory 2885, pack management circuitry 2890, an analog to digital converter 2895, and a wireless transceiver 2900 connected to the one or more processors 2880 where the pack management circuitry 2890 includes circuitry necessary for pack state control such as during charging discharging, adding and removing batteries and packs, and turning a pack 15 off or placing it into a sleep mode. Each of the one or more packs 15 in a power distribution system contain an LCP 5, one or more batteries 2905, one or more sensors 2910, one or more pack state control devices 2915, and the wiring and hardware 2920 necessary to control the system during charging discharging, adding and removing batteries and packs, and turning a pack 15 off or placing it into a sleep mode. Contact and non-contact sensors may be included in the system. The one or more batteries 2905 may be placed in series, parallel, or a combination of the two to create the desired system voltage and current capacity. The one or more pack state control devices 2915 may include devices to control state variables within the pack such as temperature, voltage, vibration, charge rate, and discharge rate. Pack state control devices may include, but are not limited to, fans, heaters, pumps, campers, Peltier devices, and solid state voltage and current controlling devices.

Figure 27:
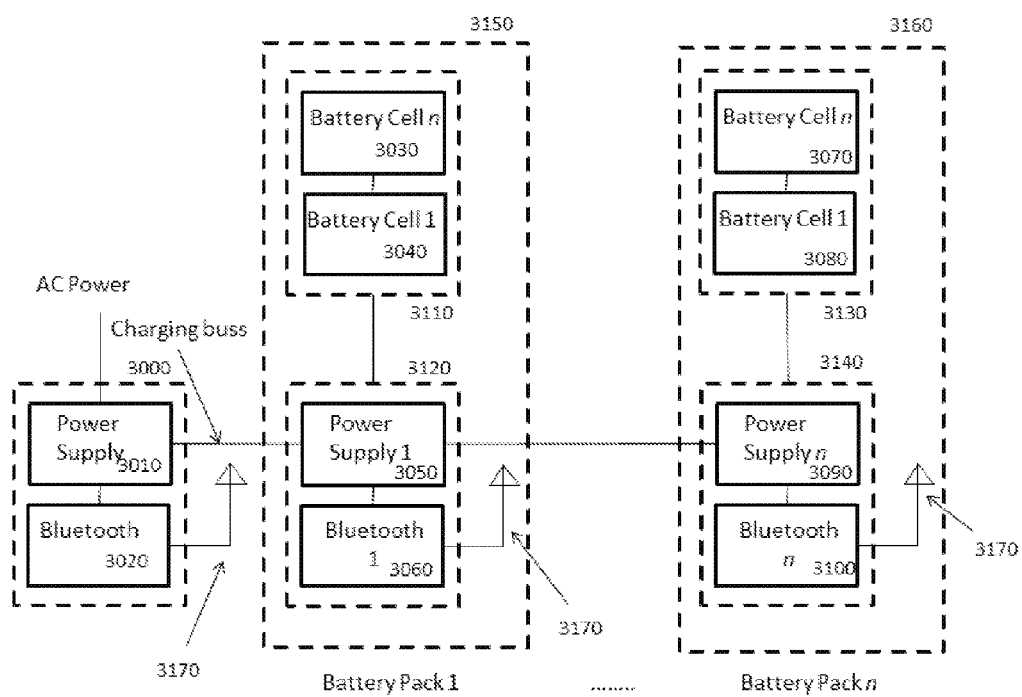
FIG. 27 (Centralized Topology) is a diagram that depicts how the networks connect the distributed nodes together to a centralized controller FIG. 28 (De-centralized Topology) is a diagram that depicts how the networks connect the distributed nodes together through a wireless device to a server.

FIG. 27, shows a system to topology including a power supply 3010, host system controller (HSC) 3020, Bluetooth transceiver and antenna 3170. The HSC power supply is connected in parallel to the battery packs (1-n) 3150 and 3170; each Battery Pack contains one or more cells (1-n) 3030-3040 and 3070-3080 in Battery Pack n; a distributed power supply 3050 and 3090 connected the one or more cells in the battery pack; and a distributed control system or Local Pack Controller (LPC) 3060 and 3100 which are connected by a wireless transceiver 3060 and 3100 to the HSC 3020. The LPC monitors the one or more cells in the Battery Packs and is configured to optimally manager the distributed power supply in each Battery Pack that is connected to the more than one cell in the Battery Pack.

Figure 28:
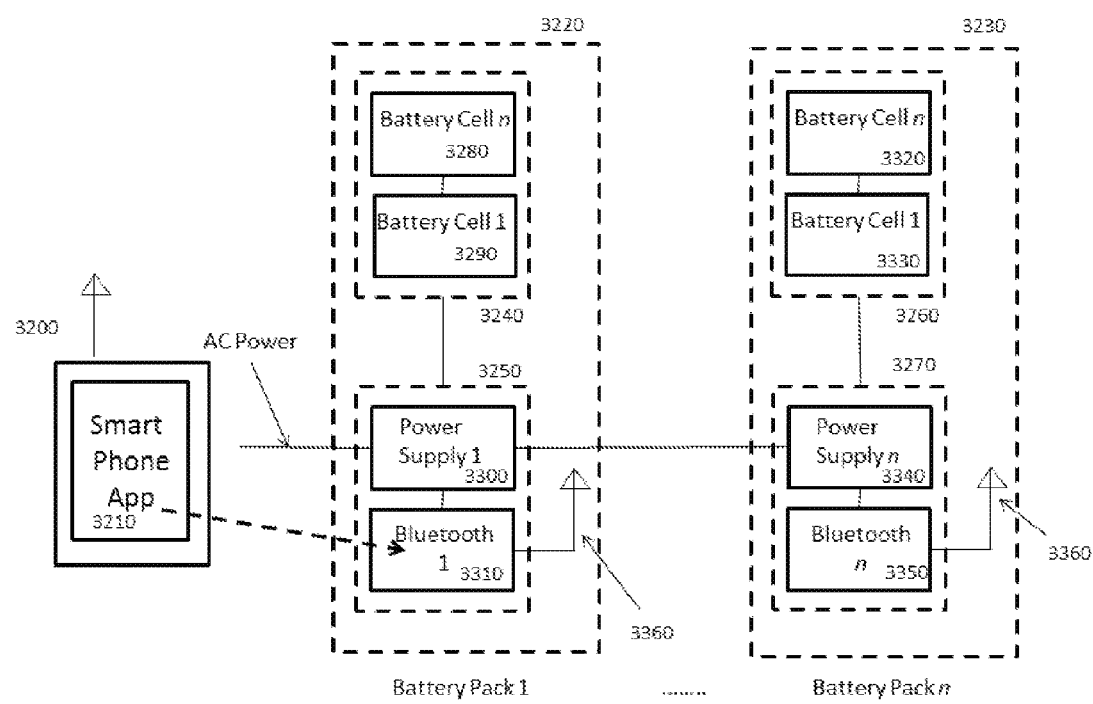

FIG. 28, shows a distributed control system topology similar to FIG. 27, with one exception; the HSC is an application 3210 running on a portable device 3200. This application lakes wireless information from the LPC's 3310 and 3350, and provides the control logic for charging and load management. Since the smart phone is typically connected to a packet network, data can be transferred to a server or for centralized management, such a fleet management for electric vehicles. The fleet vehicles can comprise industrial equipment like fork lifts; sports equipment like bikes and all-terrain vehicles, etc; as well as vehicles.

Figure 29:
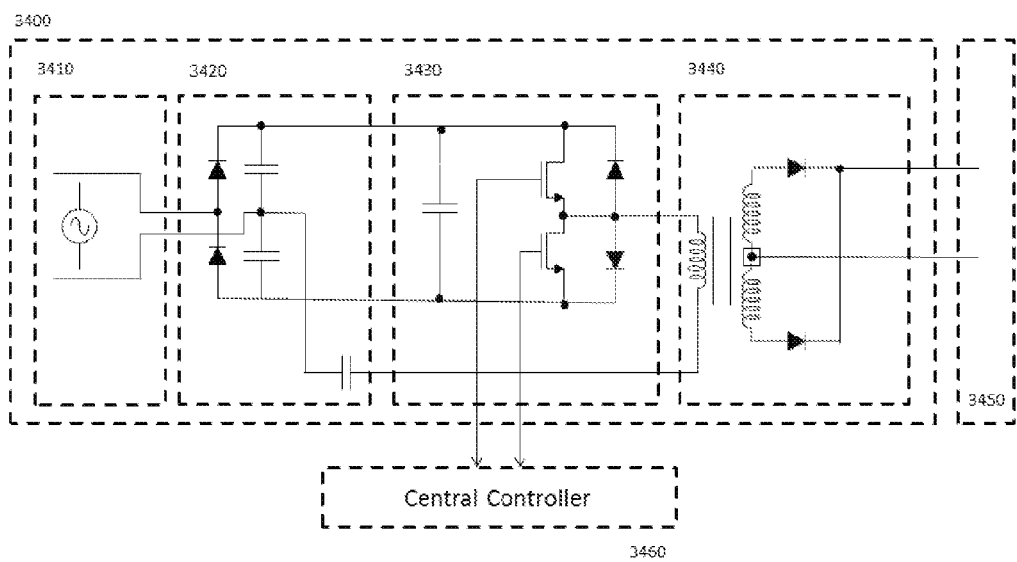
FIG. 29 (Host System Controller) is a diagram that depicts typical software elements included but not limited to the preferred embodiment.

FIG. 29, shows a power supply for a typical multi-mode battery charge circuit (e.g. constant current or constant voltage) 3400 comprising the elements of: an alternating current source 3410; a direct current half wave rectifier, a high frequency DC square wave generator 3430; and a step down transformer rectifier filter 3440 to provide at least one of constant current or constant voltage to the battery packs. The HSC 3460 regulates the output by adjusting the frequency of the electronic switches in 3430 based on predetermined conditions configured into the processor in the HSC with input from the LPC's.

Figure 30:
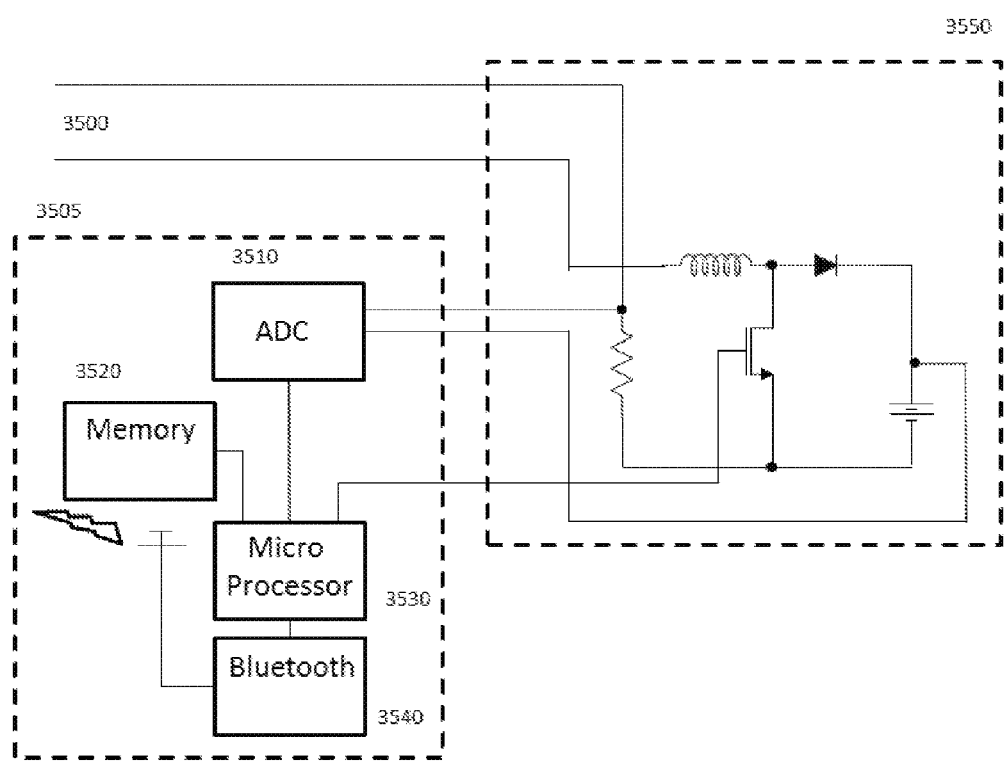
FIG. 30 (Power supply typical) is a diagram that depicts a typical power supply controlled by a logic circuit.

FIG. 30, shows the LPC 3505 and its control connection to the distributed power supply 3550 connected to one battery cell for management. The LPC 3505 comprises a microprocessor 3530, a wireless transceiver 3530, an antenna 3520, memory 3520 and an analog to digital converter (ADC) 3510. Power is supplied from the central power supply (FIG. 29) through 3500. By switching the electronic switch in 3550, constant voltage or constant current can be managed by the LPC based on predetermined software configurations in 3505. Two feedback loops to the LPC from 3550 to the ADC 3510 provide voltage or amperage values to the processor 3530.

Figure 31:
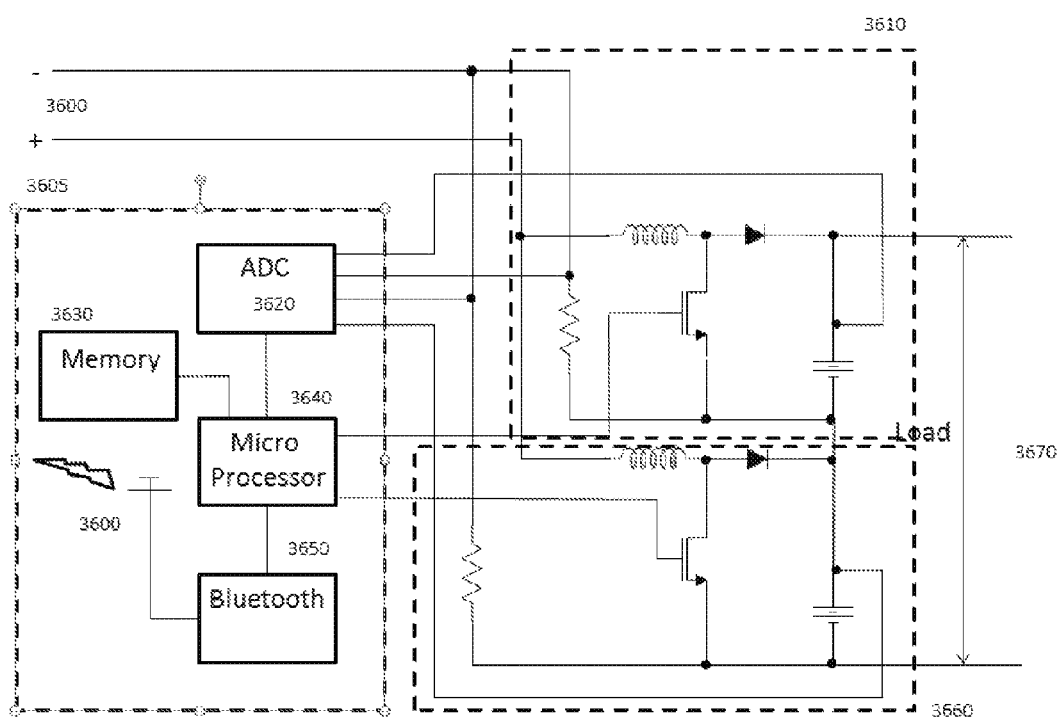
FIG. 31 (Battery management) is a diagram that depicts the distributed management of a one cell battery pack.

FIG. 31, shows the same physical and logical circuitry now connected to a more than one cell Battery Pack with more than one control and more than one feedback loop the the ADC 3620 and processor 3640. It is important to note these feedback loops may include contact and non-contact feedback for circuit operations, but may include additional sensors for monitoring sensors the charging operations, load management, system health.

Figure 32:
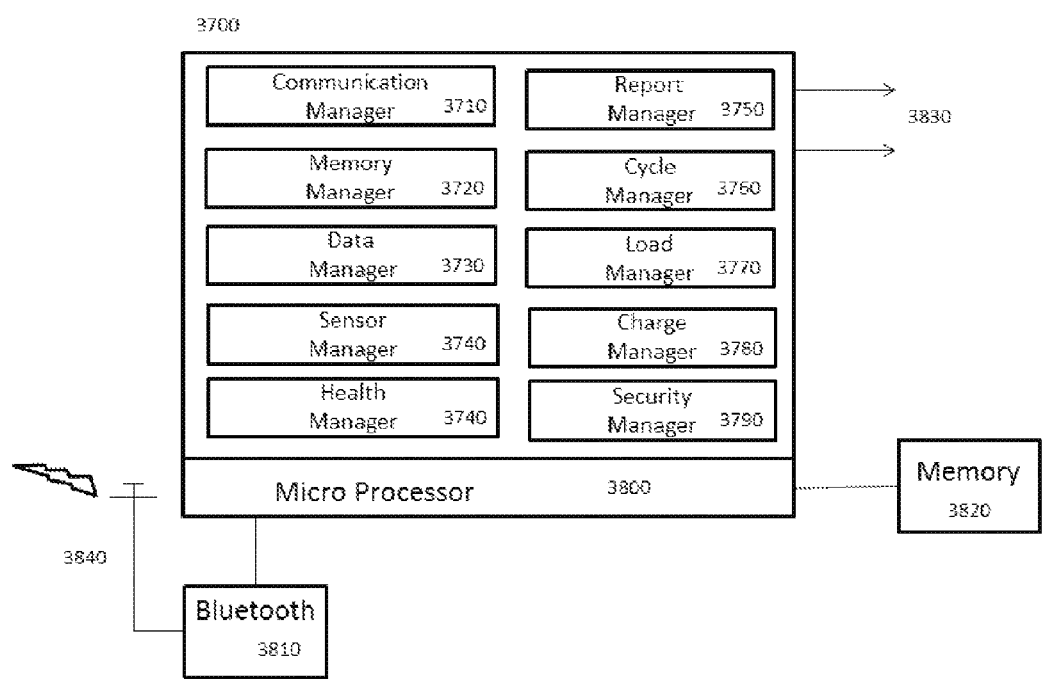
FIG. 32 (Battery management) is a diagram that depicts the distributed management of multiple cells in the battery pack.

FIG. 32, shows the software for battery management. This may run in the LPC, HPC smart wireless device or through a smart wireless device to a server. The software stack 3700 running in the processor 3800 has the responsibility of power management to include active and passive cell balancing. It is commonly known in the art that different algorithms of cell balancing are often used when multiple cells are used in a Battery. Cell balancing typically include by passing some of the cells during charge and sometimes during discharge (e.g. FIG. 31). Difference of cell voltages is a typical of unbalance, which is measured by the feedback loops to the ADC (FIGS. 30 and 31) and dynamically corrected by the processor in the LPC.

However, the underlying reasons for voltage differences on the level of battery chemistry and discharge kinetics are not widely understood and the extent of bypassing charge cannot be clearly defined. The current art of attempted balancing often causes more harm than good. In fact, many common cell balancing schemes based on voltage only result in a pack more unbalanced that without them.

Although the preferred embodiment of the system described in the disclosure is that of an electric vehicle, there are many applications outside of the automotive market. This system could be used in a variety of applications in the residential and industrial markets, from uninterruptable power supplies to battery pack recharging stations for commercial fleet and public use, and therefore should not be limited to a single embodiment.

The dynamic configuration of this system is very unique, in that it allows users to easily introduce and remove battery packs in the system. Once a pack has been physically connected to the system, it can automatically establish a secure wireless connection with the host system. In addition, the configuration of the wireless system also allows the user to connect as many devices as desired, including multiple battery packs, integrated GUI's, handheld GUI's, chargers, and other wireless devices. The wireless capabilities and automatic secure network connection of this system also make it useful for fleet services, where battery packs may need to be replaced quickly in order to keep a vehicle in operation. This will also allow fleets to manage their vehicles much more efficiently, as they will easily be able to gather usage data from each host system through the wireless network.

This system can make special use of short range wireless systems to establish secure wireless connections. These short range wireless systems may comprise components front Bluetooth, RFID, and NFC. A similar strategy to establishing a secure connection from the battery packs to the host system may also be used for connecting the host system to other devices, such as charging stations, external GUI's, and other wireless devices.

As mentioned earlier in the disclosure, state control is used to manage the operating parameters of each battery pack. This is defined as a method for monitoring and controlling each of the variables related to changes in the pack conditions during operation. For every variable of concern in the battery pack, there will be a method for monitoring and controlling the state of that variable.

The system described above can use dedicated processor systems, micro controllers, programmable logic devices, or microprocessors that perform some or all of the communication operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or described features can be implemented by themselves, or in combination with other operations in either hardware or software.

Having described and illustrated the principles of the invention in a preferred embodiment thereof, it should be apparent that the invention may be modified in arrangement and detail without departing from such principles. Claim is made to all modifications and variation coming within the spirit and scope of the following claims.

The invention claimed is:
1. A battery management system, comprising:
 a controller system comprising a first processor connected to a first memory and a first wireless transceiver connected to a wireless packet network;
 a battery system comprising a second processor connected to a second memory and a second wireless transceiver connected to the wireless packet network;

one or more batteries connected to the battery system, wherein the connected batteries comprise a battery pack;

a data stream generated from a sensor connected to the battery system and stored in the second memory that establishes a battery capability and status unique to each battery in the battery pack, wherein the stored data stream is stored as a battery record with a universal unique identifier specific to the battery.

2. The system of claim 1 wherein the wireless packet network establishes communication between the controller system and the battery pack.

3. The system of claim 1 further comprising one or more sensors connected to the second processor and connected to the one or more batteries in the battery pack, wherein the second processor is configured to:

detect a connection to the one or more batteries, use the one or more sensors to monitor individual batteries in the battery pack during charging and discharging operations.

4. The system of claim 3 wherein the second processor is further configured to:

detect a connection to the host system controller, and transmit the battery record to the host system controller.

5. The system of claim 1 wherein the first processor in the controller system is configured to:

receive the battery record from the battery system, determine battery pack condition, allow charge or discharge at a pre-determined rate, through the wireless network by transmitting instructions to the battery system from the controller system, use the packet network to transmit at least one of the battery record, the status and condition based at least one of a predetermined condition or request from a third processor connected to the packet network.

6. The system of claim 5 wherein the instructions are related to the individual batteries according to the universal unique identifier.

7. The system of claim 1, wherein the first and second memory comprise non-volatile flash memory.

8. The system of claim 1, wherein the wireless packet network is a vehicle bus that comprises at least one of LIN, CAN, J-1850, MI, DSI, BST, MML, byteflight, flexray, IDB, 1394 and J-1708.

9. The system of claim 1, wherein the wireless packet network is TCP/IP.

10. The system of claim 1, wherein the one or more batteries are rechargeable and comprise at least one of lead acid, lithium air, lithium-ion, lithium-nickel-iron, nickel-zinc, nickel-metal hydride, iron-air, zinc-air, zinc-bromine, vanadium redox, sodium-sulfur, sodium-nickel chloride, lithium-iron sulfides, nickel-cadmium and flow battery.

11. The system of claim 1, wherein the wireless packet network is at least one of 802.11, ZigBee, Near Field Communication (NFC), Radio Frequency Identification (RFID), and Bluetooth.

12. The system of claim 1, wherein the one of more sensors include at least one of contact sensors and non-contact sensors.

13. The system of claim 12, wherein the contact sensors include at least one of voltage, amperage, and temperature.

14. The system of claim 12, wherein the non-contact sensors include at least one of inductive sensors and infrared sensors.

15. The system of claim 1, wherein the stored data stream is at least one of voltage, time to charge, time to discharge, temperature, State of Charge (SOC), and State of Health (SOH).

16. A battery management method, comprising:

connecting a controller system to a battery system, the systems comprising:

a first wireless transceiver connected to a first processor and a first memory in the controller system and further connected to a wireless packet network, a second wireless transceiver connected to a second processor and a second memory in the battery system and further connected to the wireless packet network, one or more batteries connected to the battery system, wherein the connected batteries comprise a battery pack, and a data stream generated from a sensor connected to the battery stored in the second memory that establishes a battery capability and status unique to each battery in the battery pack, wherein the stored data is stored as a battery record with a universal unique identifier specific to the battery.

17. The method of claim 16 wherein the wireless packet network establishes communication between the compiler system and the battery pack.

18. The method of claim 16 further comprising one or more sensors connected to the second processor and connected to the one or more batteries in the battery pack, wherein the second processor is configured to:

detect a connection to the one or more batteries, use the one or more sensors to monitor individual batteries in the battery pack during charging and discharging operations.

19. The method of claim 18 wherein the second processor is further configured to:

detect a connection to the host system controller, and transmit the battery record to the host system controller.

20. The method of claim 16 wherein the first processor in the controller system is configured to:

receive the battery record from the battery system, determine battery pack condition, allow charge or discharge at a pre-determined rate, through the wireless network by transmitting instructions to the battery system from the co system, use the packet network to transmit at least one of the battery record, the status and condition based at least one of a predetermined condition or request from a third processor connected to the packet network.

21. The method of claim 20 wherein the instructions are related to the individual batteries according to the universal unique identifier.

22. The method of claim 16, wherein the first and second memory comprise non-volatile flash memory.

23. The method of claim 16, wherein the wireless packet network is a vehicle bus that comprises at least one of LIN, CAN, J-1850, MI, DSI, BST, MML, byteflight, flexray, IDB, 1394 and J-1708.

24. The method of claim 16, wherein the wireless packet network is TCP/IP.

25. The method of claim 16, wherein the one or more batteries are rechargeable and comprise at least one of lead acid, lithium air, lithium-ion, lithium-polymer, nickel-iron, nickel-zinc, nickel-metal hydride, iron-air, zinc-air, zinc-bromine, vanadium redox, sodium-sulfur, sodium-nickel chloride, lithium-iron sulfides, nickel-cadmium and flow battery.

26. The method of claim 16, wherein the wireless packet network is at least one of 802.11, ZigBee, Near Field Communication (NFC), Radio Frequency Identification (RFID), and Bluetooth.

27. The method of claim 16, wherein the one of more sensors include at least one of contact sensors and non-contact sensors.

28. The method of claim 27, wherein the contact sensors include at least one of voltage, amperage, and temperature.

29. The method of claim 27, wherein the non-contact sensors include at least one of inductive sensors and infrared sensors.

30. The method of claim 16, wherein the stored data stream is east one of voltage, time to charge, time to discharge, temperature, State of Charge (SOC), and State of Health (SOH).

* * * * *